United States Patent
Yamada

(10) Patent No.: US 11,824,108 B2
(45) Date of Patent: Nov. 21, 2023

(54) SEMICONDUCTOR DEVICE

(71) Applicant: FUJITSU LIMITED, Kawasaki (JP)

(72) Inventor: Atsushi Yamada, Hiratsuka (JP)

(73) Assignee: FUJITSU LIMITED, Kawasaki (JP)

( * ) Notice: Subject to any disclaimer, the term of this patent is extended or adjusted under 35 U.S.C. 154(b) by 147 days.

(21) Appl. No.: 17/190,276

(22) Filed: Mar. 2, 2021

(65) Prior Publication Data

US 2021/0288169 A1    Sep. 16, 2021

(30) Foreign Application Priority Data

Mar. 10, 2020 (JP) ................ 2020-041232

(51) Int. Cl.
    *H01L 29/20*   (2006.01)
    *H01L 29/778*  (2006.01)
    *H01L 29/207*  (2006.01)
    *H01L 29/205*  (2006.01)

(52) U.S. Cl.
    CPC ...... *H01L 29/7783* (2013.01); *H01L 29/2003* (2013.01); *H01L 29/205* (2013.01); *H01L 29/207* (2013.01)

(58) Field of Classification Search
    CPC .. H01L 29/7783; H01L 29/205; H01L 29/207
    See application file for complete search history.

(56) References Cited

U.S. PATENT DOCUMENTS

| 7,544,963 B2 | 6/2009 | Saxler |
| 2013/0141156 A1 | 6/2013 | Teo et al. |
| 2014/0367743 A1* | 12/2014 | Inoue .......... H01L 29/7783 257/194 |

(Continued)

FOREIGN PATENT DOCUMENTS

| JP | H09330916 A | 12/1997 |
| JP | 2013-118383 A | 6/2013 |

(Continued)

OTHER PUBLICATIONS

Northrup et al. (Physical review B, vol. 55, No. 20, 15, May 1997).*

(Continued)

*Primary Examiner* — Ali Naraghi
*Assistant Examiner* — Siangluai Mang
(74) *Attorney, Agent, or Firm* — ArentFox Schiff LLP

(57) ABSTRACT

A semiconductor device includes: a base of a first nitride semiconductor; a buffer layer of a second nitride semiconductor provided on or above the base; a channel layer of a third nitride semiconductor provided on or above the buffer layer and having an opening portion; a barrier layer of a fourth nitride semiconductor provided on or above the channel layer; and an electrically conductive contact layer of a fifth nitride semiconductor provided in the opening portion and in contact with the buffer layer and the channel layer. A ratio of Al in a composition of the second nitride semiconductor is higher than or equal to that of the third nitride semiconductor. A ratio of Al in a composition of the first nitride semiconductor and a ratio of Al in a composition of the fourth nitride semiconductor are higher than that of the second nitride semiconductor.

14 Claims, 22 Drawing Sheets

(56) References Cited

U.S. PATENT DOCUMENTS

| | | | |
|---|---|---|---|
| 2015/0236121 A1* | 8/2015 | Chiu | H01L 21/02505 257/194 |
| 2016/0155828 A1* | 6/2016 | Sugawara | H01L 21/02565 438/104 |
| 2016/0172476 A1* | 6/2016 | Kikkawa | H01L 29/66462 438/172 |
| 2016/0181364 A1* | 6/2016 | Stewart | H01L 29/66477 257/192 |
| 2016/0254378 A1* | 9/2016 | Inoue | H01L 21/02507 257/20 |
| 2017/0047437 A1* | 2/2017 | Nakayama | H01L 21/2258 |
| 2017/0092751 A1 | 3/2017 | Frijlink | |
| 2017/0125516 A1* | 5/2017 | Ishiguro | H01L 29/7786 |
| 2017/0125545 A1* | 5/2017 | Yamada | H01L 29/7786 |
| 2017/0125567 A1* | 5/2017 | Yamada | H01L 29/66462 |
| 2017/0250274 A1* | 8/2017 | Nakayama | H01L 29/42364 |
| 2018/0076355 A1* | 3/2018 | Hayashi | H01L 33/32 |
| 2018/0145148 A1* | 5/2018 | Yamada | H01L 29/66431 |
| 2019/0096879 A1* | 3/2019 | Chen | H01L 27/0629 |
| 2019/0214494 A1 | 7/2019 | Yamada et al. | |
| 2019/0296137 A1 | 9/2019 | Yamada et al. | |

FOREIGN PATENT DOCUMENTS

| | | |
|---|---|---|
| JP | 2017-085060 A | 5/2017 |
| JP | 2017-514316 A | 6/2017 |
| JP | 2019-125600 A | 7/2019 |
| JP | 2019-165172 A | 9/2019 |

OTHER PUBLICATIONS

Northrup et al. (Physical review B, vol. 55, No. 20, May 15, 1997).*
Office Action issued by the Japanese Patent Office in Japanese Patent Application No. 2020-041232, dated Sep. 26, 2023.

* cited by examiner

SEMICONDUCTOR DEVICE

CROSS-REFERENCE TO RELATED APPLICATION

This application is based on and claims priority to Japanese Patent Application No. 2020-041232 filed on Mar. 10, 2020, the entire contents of which are incorporated herein by reference.

FIELD

The embodiments discussed herein relate to a semiconductor device.

With respect to semiconductor devices using compound semiconductors, there are many reports on field effect transistors, particularly high electron mobility transistors (HEMTs). As a HEMT using nitride semiconductors, a HEMT using a GaN layer for a channel layer and an AlGaN layer for a barrier layer is known. In such a GaN-based HEMT, distortion caused by the difference between the lattice constant of AlGaN and the lattice constant of GaN occurs in the AlGaN layer. Due to this distortion, piezo polarization occurs, and a high-concentration two-dimensional electron gas is generated near the upper surface of the GaN layer under the AlGaN layer. Thereby, a high output is obtained.

A quantum confinement structure transistor using a large band offset between AlN and GaN is also proposed in order to enhance mobility.

RELATED-ART DOCUMENTS

Patent Documents

[Patent Document 1] U.S. Pat. No. 7,544,963
[Patent Document 2] Japanese National Publication of International Patent Application No. 2013-118383
[Patent Document 3] Japanese National Publication of International Patent Application No. 09-330916

However, with a conventional quantum confinement structure transistor, it is difficult to reduce the on resistance.

The present disclosure has an object to provide a semiconductor device that can reduce the on resistance.

SUMMARY

According to one aspect of the present disclosure, a semiconductor device includes: a base of a first nitride semiconductor; a buffer layer of a second nitride semiconductor provided on or above the base; a channel layer of a third nitride semiconductor provided on or above the buffer layer and having an opening portion; a barrier layer of a fourth nitride semiconductor provided on or above the channel layer; and a contact layer of a fifth nitride semiconductor provided in the opening portion and in contact with the buffer layer and the channel layer, the contact layer being electrically conductive. A ratio of Al in a composition of the second nitride semiconductor is higher than or equal to a ratio of Al in a composition of the third nitride semiconductor. A ratio of Al in a composition of the first nitride semiconductor and a ratio of Al in a composition of the fourth nitride semiconductor are higher than the ratio of Al in the composition of the second nitride semiconductor.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENT (Outline of Quantum Confinement Structure Transistor)

Figure 1:
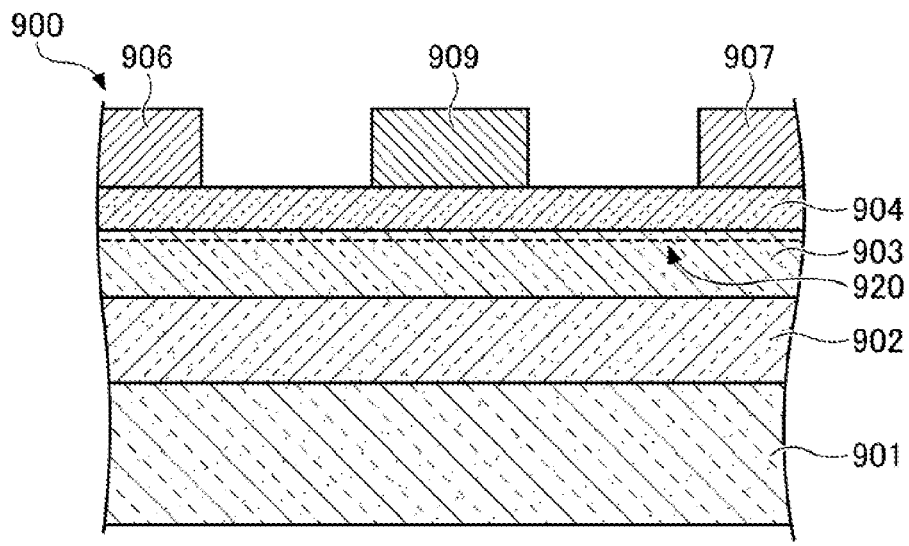
FIG. 1 is a cross-sectional view illustrating a semiconductor device according to a reference example.

First, an outline of a quantum confinement structure transistor will be described. FIG. 1 is a cross-sectional view illustrating a semiconductor device 900 including a quantum confinement structure transistor according to a reference example.

In the semiconductor device 900 according to the reference example, as illustrated in FIG. 1 an AlN barrier layer 902, a GaN channel layer 903, and an InAlGaN barrier layer 904 are formed on an AlN substrate 901. A source electrode 906, a gate electrode 909, and a drain electrode 907 are also formed on the InAlGaN barrier layer 904. Then, a high-concentration two-dimensional gas (2DEG) 920 is present near the upper surface of the GaN channel layer 903.

In the semiconductor device 900, the higher the ratio of Al in the composition in the InAlGaN barrier layer 904, the higher the barrier in the quantum confinement structure. Conversely, as the ratio of Al in the composition increases, the contact resistance between the InAlGaN barrier layer 904 and the source and drain electrodes 906 and 907 increases. Accordingly, in the semiconductor device 900, if increasing the ratio of Al in the composition in the InAlGaN barrier layer 904 in order to obtain a favorable quantum confinement effect, the on resistance becomes high.

In order to reduce the contact resistance, it is considered that portions of the InAlGaN barrier layer 904 and GaN channel layer 903 overlapping the source electrode 906 and the drain electrode 907 in plan view are etched to expose the AlN barrier layer 902 and an n-type GaN contact layer is regrown on the exposed portions. However, when an n-type GaN contact layer is regrown at a temperature of approximately 1000° C., a large thermal stress is applied between the GaN channel layer 903 and the barrier layers 902 and 904, causing damage such as a crack. By re-growing the n-type GaN contact layer at a relatively low temperature, the damage can be suppressed, but in this case, the n-type GaN contact layer regrows with a shape of islands on the AlN barrier layer 902.

Figure 2:
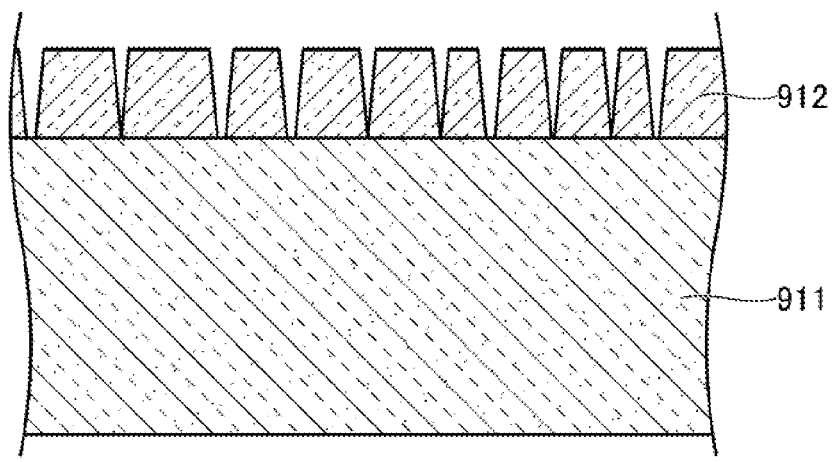
FIG. 2 is a cross-sectional view illustrating an n-type GaN layer formed on an AlN layer.

FIG. 2 is a cross-sectional view illustrating an n-type GaN layer formed on an AlN layer. The a-axis lattice constant of AlN is approximately 3.11 Å, the a-axis lattice constant of GaN is 3.19 Å, and the a-axis lattice constant of GaN is approximately 2.6% higher than the a-axis lattice constant of AlN. Thus, when an n-type GaN layer 912 is epitaxially grown on an AlN layer 911 at a relatively low temperature, the growth mode of the n-type GaN layer 912 is Volmer-Weber mode. As a result, as illustrated in FIG. 2, the n-type GaN layer 912 grows with a shape of islands, and the surface of the n-type GaN layer 912 becomes highly rough. Therefore, the electrical resistance of the n-type GaN layer 912 in the direction parallel to the surface of the AlN layer 911 is large, and it is difficult to reduce the on resistance.

Accordingly, the inventor of the present invention diligently investigated a structure such that a contact layer having a low surface roughness is obtained. As a result, it has been found that a contact layer having a low surface roughness is obtained in a structure in which a buffer layer with a predetermined composition is provided between a base and the contact layer.

Figure 3:
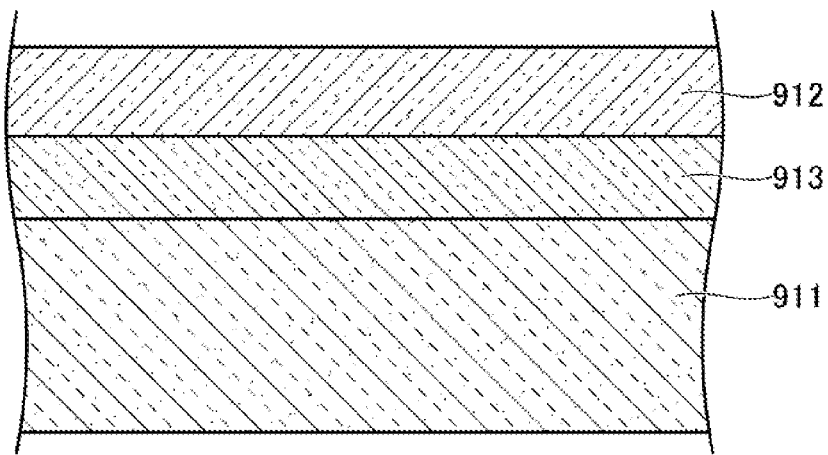
FIG. 3 is a cross-sectional view illustrating an n-type GaN layer formed above an AlN layer via an AlGaN buffer layer.

FIG. 3 is a cross-sectional view illustrating an n-type GaN layer formed above an AlN layer via an AlGaN buffer layer. When an AlGaN layer 913 is formed on an AlN layer 911 and an n-type GaN layer 912 is epitaxially grown on the AlGaN layer 913 at a relatively low temperature, the n-type GaN layer 912 grows with a film shape, as illustrated in FIG. 3. This is because the difference between the lattice constant of AlN and the lattice constant of AlGaN is less than the difference between the lattice constant of AlN and the lattice constant of GaN, and the difference between the lattice constant of AlGaN and the lattice constant of GaN is less than the difference between the lattice constant of AlN and the lattice constant of GaN. Accordingly, it is possible to reduce the on resistance by including such a buffer layer.

Based on these findings, the inventor of the present invention has arrived at the embodiments described below. Hereinafter, embodiments of the present disclosure will be described in detail with reference to the accompanying drawings. In the present specification and the drawings, duplicated descriptions of elements having substantially the same functional configuration may be omitted by providing the same reference numerals.

First Embodiment

Figure 4:
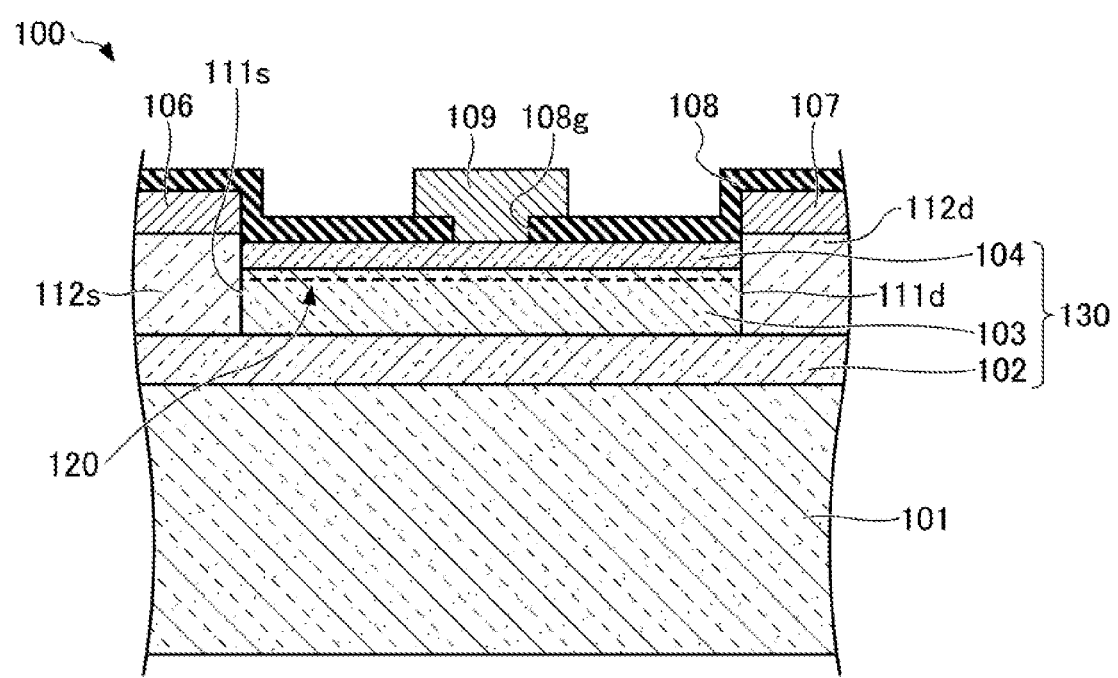
FIG. 4 is a cross-sectional view illustrating a semiconductor device according to a first embodiment.

A first embodiment will be described. The first embodiment relates to a semiconductor device including a high electron mobility transistor (HEMT) having a quantum confinement structure. FIG. 4 is a cross-sectional view illustrating a semiconductor device 100 according to the first embodiment.

In the semiconductor device 100 according to the first embodiment, as illustrated in FIG. 4, a nitride semiconductor layered structure 130 is formed over a substrate 101. The nitride semiconductor layered structure 130 includes a buffer layer 102, a channel layer 103 and a barrier layer 104. The buffer layer 102 is formed on the substrate 101. The channel layer 103 is formed on the buffer layer 102. The barrier layer 104 is formed on the channel layer 103.

The substrate 101 is, for example, an AlN-free standing substrate, and the upper surface of the substrate 101 is an Al polar surface. That is, the Miller index of the upper surface of the substrate 101 is (0001). The buffer layer 102 is, for example, an $Al_{x1}Ga_{1-x1}N$ layer ($0.00 \leq x1 \leq 0.20$) with a thickness of 30 nm to 100 nm. The channel layer 103 is, for example, a GaN layer having a thickness of 50 nm or less. The barrier layer 104 is, for example, an $In_{y2}Al_{x2}Ga_{1-x2-y2}N$ layer ($0.00 \leq x2 \leq 1.00$, $0.00 \leq y2 \leq 0.20$) with a thickness of 4 nm to 20 nm. The thickness of the channel layer 103 is preferably 50 nm or less, and is more preferably 20 nm or less. This is for obtaining an excellent quantum confinement effect. The thickness of the buffer layer 102 is preferably 20 nm or less and is more preferably 5 nm or less. This is for reducing the thermal resistance of the buffer layer 102. The Miller index of the upper surface of each of the buffer layer 102, the channel layer 103, and the barrier layer 104 is also (0001). The substrate 101 is an example of a base. AlN of the substrate 101 is an example of a first nitride semiconductor. $Al_{x1}Ga_{1-x1}N$ ($0.00 \leq x1 \leq 0.20$) of the buffer layer 102 is an example of a second nitride semiconductor. GaN of the channel layer 103 is an example of a third nitride semiconductor. $In_{y2}Al_{x2}Ga_{1-x2-y2}N$ ($0.00 \leq x2 \leq 1.00$, $0.00 \leq y2 \leq 0.20$) of the barrier layer 104 is an example of a fourth nitride semiconductor. The ratio of Al in the composition of GaN is 0.00.

An element isolation area defining an element area is formed in the nitride semiconductor layered structure 130, and an opening portion 111s for source and an opening portion 111d for drain are formed in the barrier layer 104 and the channel layer 103 within the element area. A conductive contact layer 112s for source is formed in the opening portion 111s and a conductive contact layer 112d for drain is formed in the opening portion 111d. For example, the contact layers 112s and 112d are an n-type GaN layer having a thickness of 40 nm to 70 nm. For example, the contact layers 112s and 112d are doped with Si at a concentration of approximately $1 \times 10^{19}$ cm$^{-3}$ as an n-type impurity. The contact layers 112s and 112d may be doped with Ge, 0, or the like as an n-type impurity. Here, n-type GaN of the contact layers 112s and 112d is an example of a fifth nitride semiconductor, which may be contained at a concentration of $1 \times 10^{17}$ cm$^{-3}$ to $5 \times 10^{20}$ cm$^{-3}$.

A source electrode 106 is formed on the contact layer 112s and a drain electrode 107 is formed on the contact layer 112d. The source electrode 106 forms an ohmic contact with the contact layer 112s, and the drain electrode 107 forms an ohmic contact with the contact layer 112d. A passivation film 108 is formed over the barrier layer 104 to cover the source electrode 106 and the drain electrode 107. An opening portion 108g is formed in the passivation film 108 at a position between the source electrode 106 and the drain electrode 107 in plan view, and a gate electrode 109 is formed on the passivation film 108 through the opening portion 108g in contact with the barrier layer 104.

The source electrode 106 and the drain electrode 107 include, for example, a Ta film having a thickness of 10 nm to 50 nm and an Al film having a thickness of 100 nm to 500 nm on the Ta film. The source electrode 106 forms an ohmic contact with the contact layer 112s, and the drain electrode 107 forms an ohmic contact with the contact layer 112d. The gate electrode 109 includes, for example, a Ni film having a thickness of 10 nm to 50 nm and an Au film having a thickness of 300 nm to 500 nm on the Ni film, and forms a Schottky contact with the nitride semiconductor layered structure 130. For example, the passivation film 108 is a film of oxide, nitride, or oxynitride of Si, Al, Hf, Zr, Ti, Ta or W, and is preferably a film of Si nitride (SiN). For example, the thickness of the passivation film 108 is 2 nm to 500 nm, and is preferably approximately 100 nm.

Figure 5:
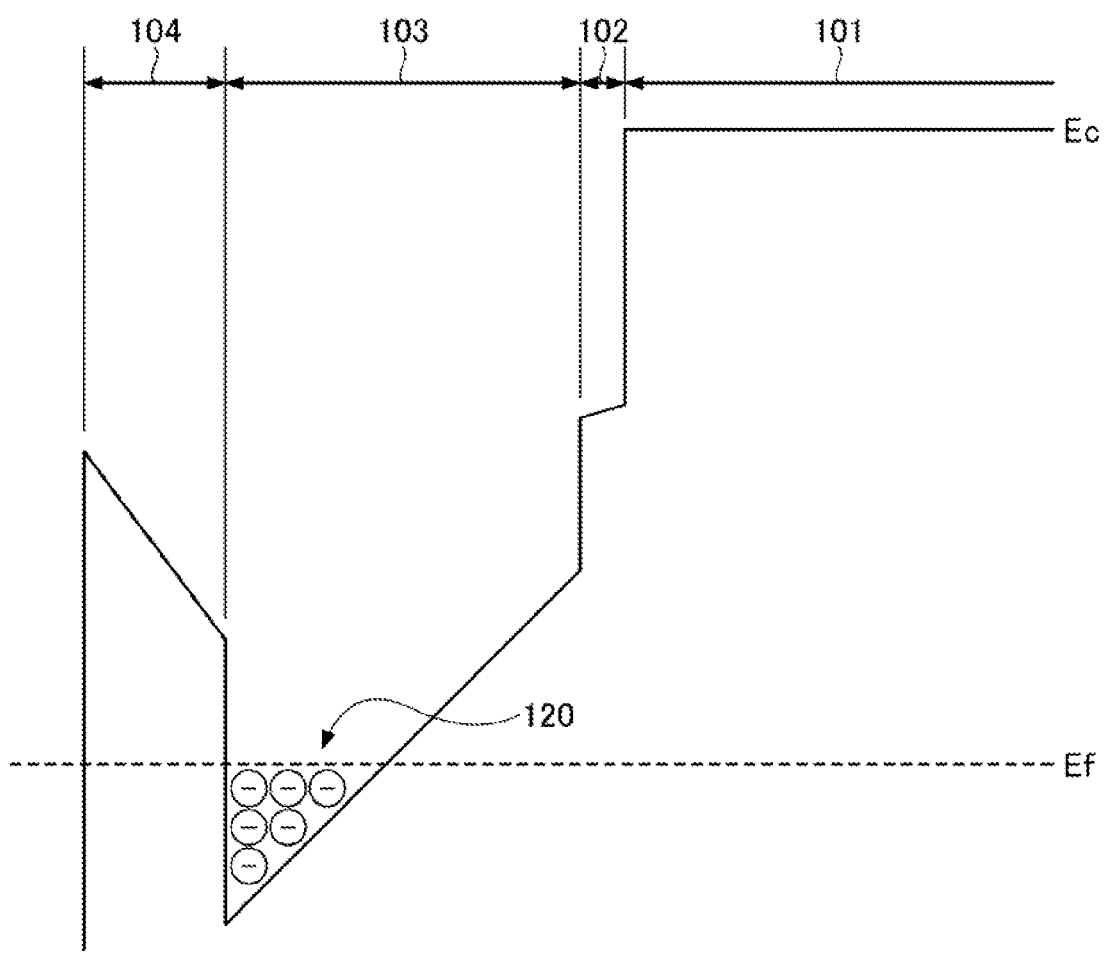
FIG. 5 is a band diagram illustrating a conduction band Ec of a semiconductor device according to the first embodiment.

Next, a band structure of the semiconductor device 100 will be described. FIG. 5 is a band diagram illustrating a conduction band Ec of the semiconductor device 100. A Fermi level Ef is also illustrated in FIG. 5. In the semiconductor device 100, the ratio (x1) of Al in the composition of the buffer layer 102 is higher than or equal to the ratio of Al in the composition (e.g., 0.00) of the channel layer 103, and the ratio of Al in the composition (e.g., 1.00) of the substrate 101 and the barrier layer 104 is higher than the ratio (x1) of Al in the composition of the buffer layer 102. The surface of the substrate 101 is also a (0001) surface. Thus, as illustrated in FIG. 4 and FIG. 5, a high-concentration 2DEG 120 is present near the upper surface of the channel layer 103. Because the substrate 101 has strong spontaneous polarization, even though the buffer layer 102 is provided between the substrate 101 and the channel layer 103, an excellent quantum confinement effect can be obtained with respect to the 2DEG 120.

Next, a method of manufacturing the semiconductor device 100 according to the first embodiment will be described. FIG. 6 to FIG. 9 are cross-sectional views illustrating the method of manufacturing the semiconductor device 100 according to the first embodiment.

Figure 6A:
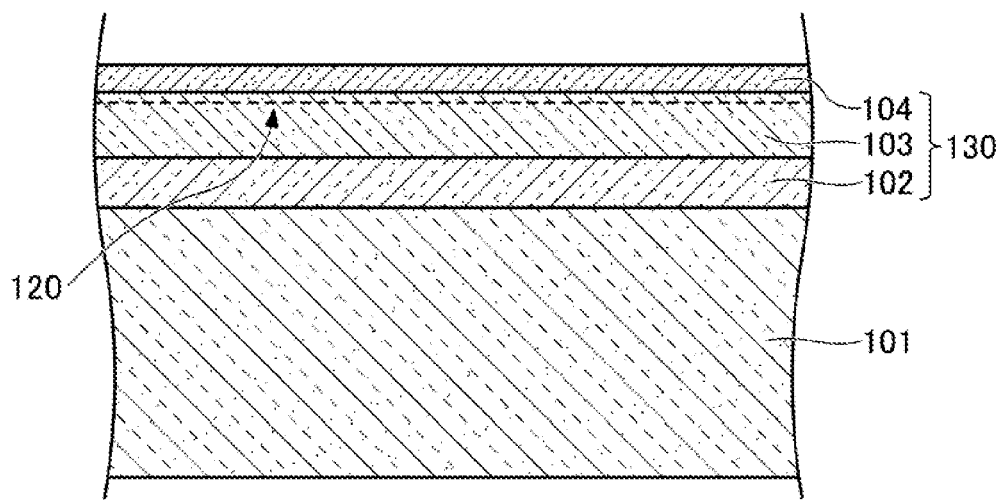
FIGS. 6A and 6B are cross-sectional views illustrating a step of a method of manufacturing a semiconductor device according to the first embodiment.

First, as illustrated in FIG. 6A, a nitride semiconductor layered structure 130 is formed on the (0001) surface of a substrate 101. In the formation of the nitride semiconductor layered structure 130, a buffer layer 102, a channel layer 103, and a barrier layer 104 are formed by, for example, metal organic vapor phase epitaxy (MOVPE). When forming the nitride semiconductor layered structure 130, for example, as a material gas, a mix gas of a trimethylaluminum (TMAl) gas that is an Al source, a trimethylgallium (TMGa) gas that is a Ga source, a trimethylindium (TMIn) gas that is an In source, and an ammonia (NH$_3$) gas that is an N source is used. A hydrogen (H$_2$) gas or a nitrogen (N$_2$) gas is used as the carrier gas. Depending on the composition of nitride semiconductor layers to be grown, whether to supply or not the TMAl gas, the TMGa gas, and the TMIn gas and their flow rates are set as appropriate. For example, the growth pressure is approximately 1 kPa to 100 kPa and the growth temperature is approximately 600° C. to 1500° C. The formation of the barrier layer 104 generates a 2DEG 120 near the upper surface of the channel layer 103. In a case in which the ratio (x1) of Al in the composition of the buffer layer 102 is low, the buffer layer 102 is preferably grown at a relatively high temperature, which is, for example, 1000° C. to 1500° C., in order to obtain favorable flatness on the surface of the buffer layer 102. Growing the buffer layer 102 at relatively high temperatures does not cause damage, such as a crack, because it is prior to formation of the channel layer 103 and the barrier layer 104.

Figure 6B:
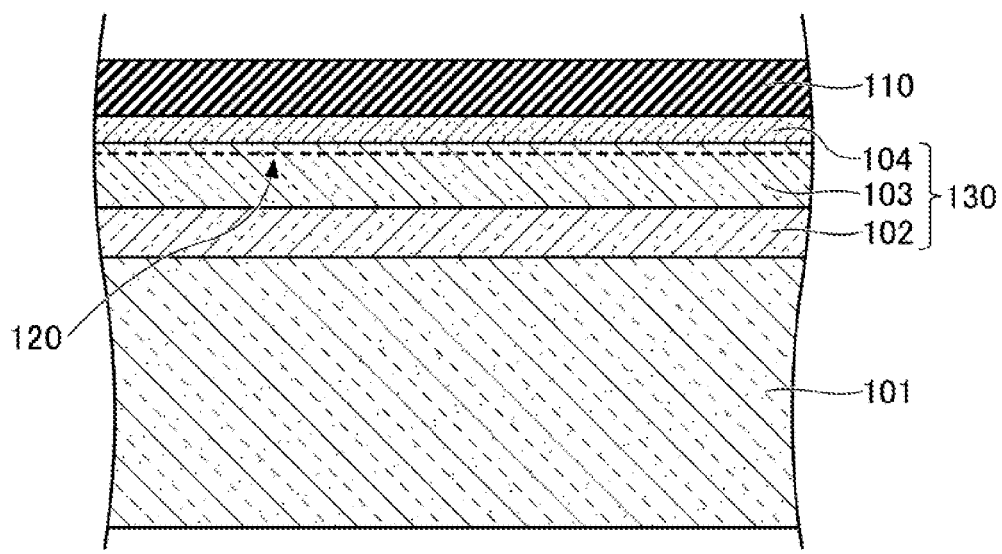

A surface protective film 110 is then formed on the barrier layer 104, as illustrated in FIG. 6B. The surface protective film 110 is, for example, a film of oxide, nitride or oxynitride of Si, Al, Hf, Zr, Ti, Ta or W, and is preferably a film of Si oxide (SiO$_2$). The surface protective film 110 can be formed, for example, by a plasma chemical vapor deposition (CVD) process. The surface protective film 110 may be formed by an atomic layer deposition (ALD) process or a sputtering process.

Figure 7A:
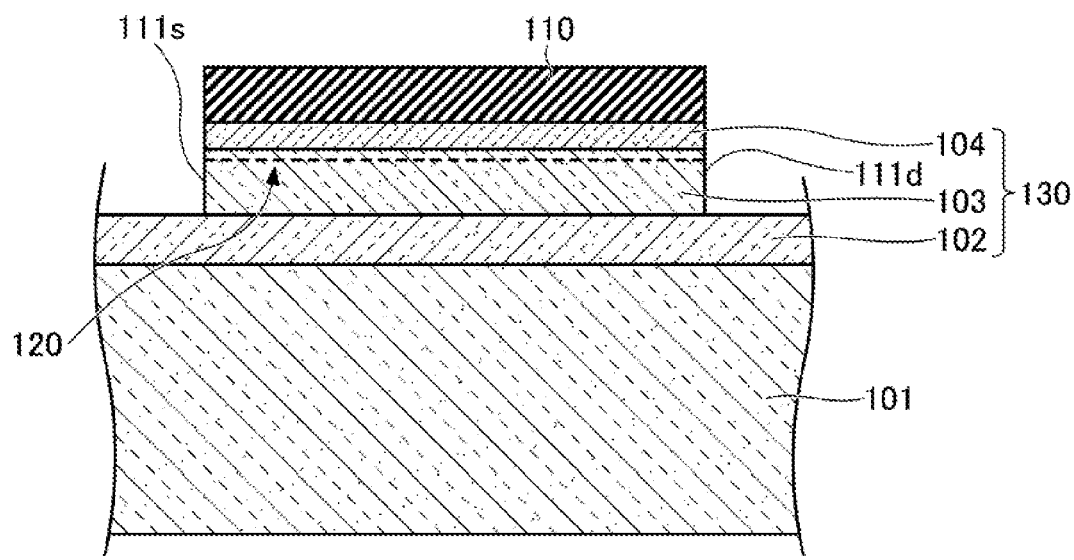
FIGS. 7A and 7B are cross-sectional views illustrating a step of the method of manufacturing a semiconductor device according to the first embodiment.

Thereafter, on the surface protective film 110, the barrier layer 104, and the channel layer 103, an opening portion 111s for source and an opening portion 111d for drain are formed, as illustrated in FIG. 7A. In the formation of the opening portions 111s and 111d, for example, a photoresist pattern is formed by photolithography on the surface protective film 110 to expose areas where the opening portions 111s and 111d are to be formed. Then, dry etching is performed using a fluorine-based gas or a chlorine-based gas with the pattern as an etching mask. As a result, the buffer layer 102 is exposed at the opening portions 111s and 111d.

Figure 7B:
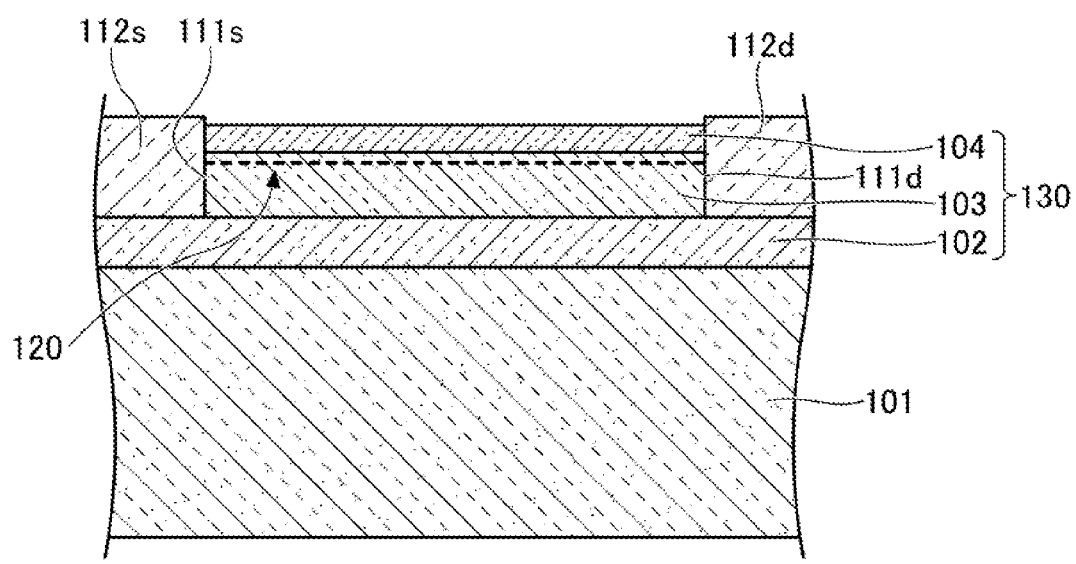

Subsequently, as illustrated in FIG. 7B, a contact layer 112s is formed in the opening portion 111s and a contact layer 112d is formed in the opening portion 111d. The contact layers 112s and 112d can be formed, for example, by a MOVPE process. When forming the contact layers 112s and 112d, a H$_2$ gas or a N$_2$ gas is used as the carrier gas, and a mixture gas of a TMGa gas and a NH$_3$ gas is used as the material gas. At this time, for example, in order to make the contact layers 112s and 112d n-type, a silane (SiH$_4$) gas containing Si is added to the mixture gas at a predetermined flow rate to dope Si to the contact layers 112s and 112d. For example, when the contact layers 112s and 112d are grown, the growth pressure is approximately 1 kPa to 100 kPa and the growth temperature is approximately 700° C. to 900° C. It is preferable that the contact layers 112s and 112d are grown at a temperature at which damage, such as a crack, to the nitride semiconductor layered structure 130 is not easily caused due to thermal stress. After the contact layers 112s and 112d are formed, the surface protective film 110 is removed. Ge or O may be used as an n-type impurity doped to the contact layers 112s and 112d. The upper surfaces of the contact layers 112s and 112d may be above the upper surface of the barrier layer 104, may be flush with the upper surface of the barrier layer 104, or may be below the upper surface of the barrier layer 104.

Then, in the nitride semiconductor layered structure 130, an element isolation area that defines an element area is formed. In the formation of the element isolation area, for example, a photoresist pattern is formed on the nitride semiconductor layered structure 130 to expose an area where the element isolation area is to be formed, and ion implantation with Ar or the like is performed with the pattern as a mask. Using a chlorine-based gas with the pattern as an etching mask, dry etching may be performed.

Figure 8A:
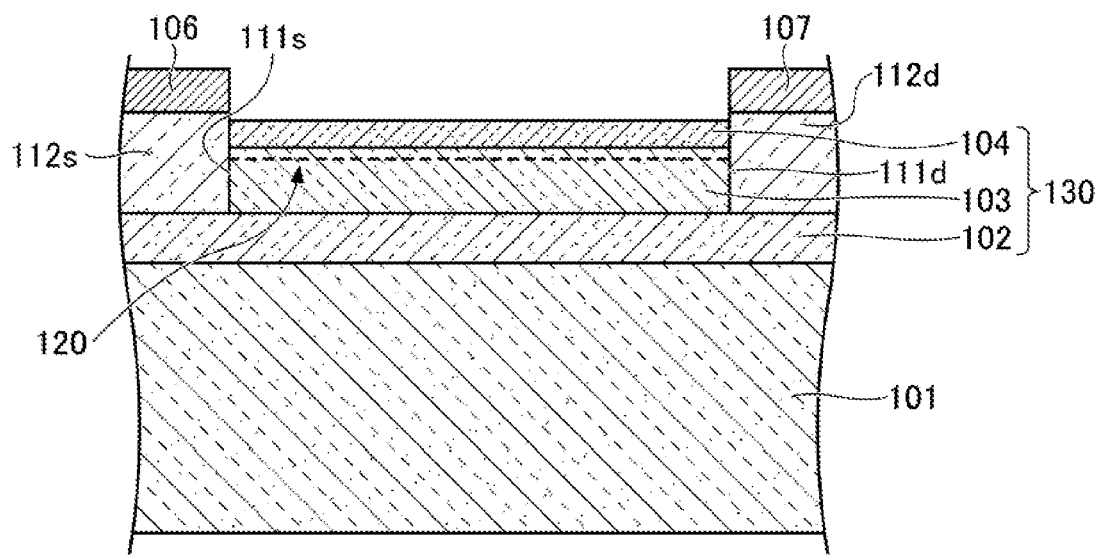
FIGS. 8A and 8B are cross-sectional views illustrating a step of the method of manufacturing a semiconductor device according to the first embodiment.

Then, as illustrated in FIG. 8A, a source electrode 106 is formed on the contact layer 112s and a drain electrode 107 is formed on the contact layer 112d. The source electrode 106 and the drain electrode 107 can be formed, for example, by a lift-off process. That is, a photoresist pattern is formed to expose areas where the source electrode 106 and the drain electrode 107 are to be formed, a metal film is formed with the pattern as a growth mask by a deposition process, and the pattern is removed together with the metal film thereon. In the formation of the metal film, for example, a Ta film is formed, and an Al film is formed on the Ta film. Then, for example, a heat treatment is performed in a nitrogen atmosphere at 400° C. to 1000° C., preferably at approximately 550° C., to establish ohmic characteristics.

Figure 8B:
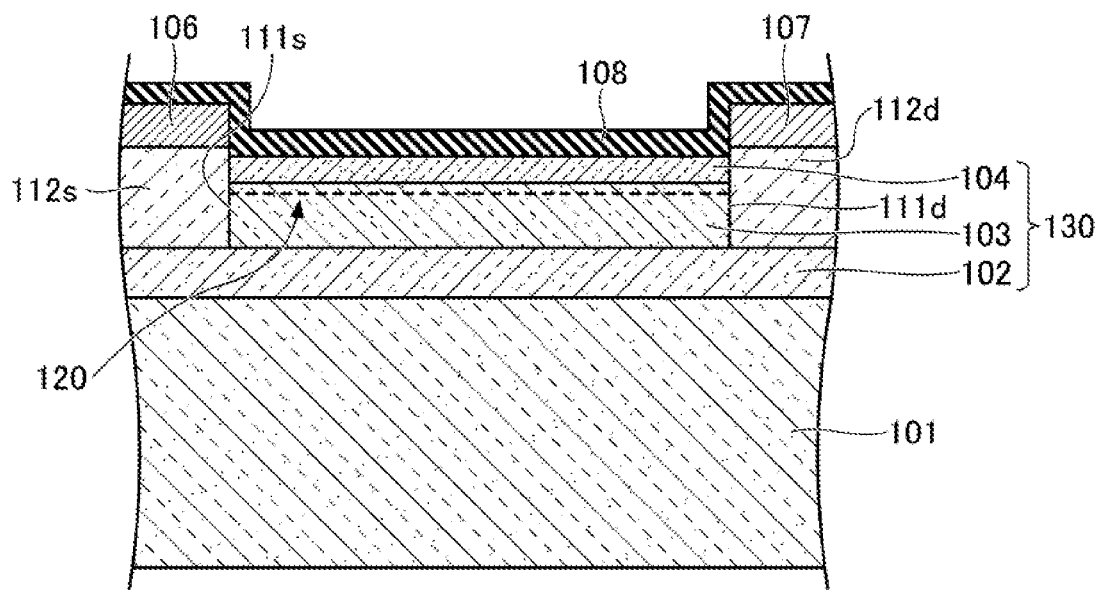

Then, as illustrated in FIG. 8B, a passivation film 108 is formed over the barrier layer 104 to cover the source electrode 106 and the drain electrode 107. The passivation film 108 can be formed, for example, by a plasma CVD process. The passivation film 108 may be formed by an ALD process or a sputtering process.

Figure 9A:
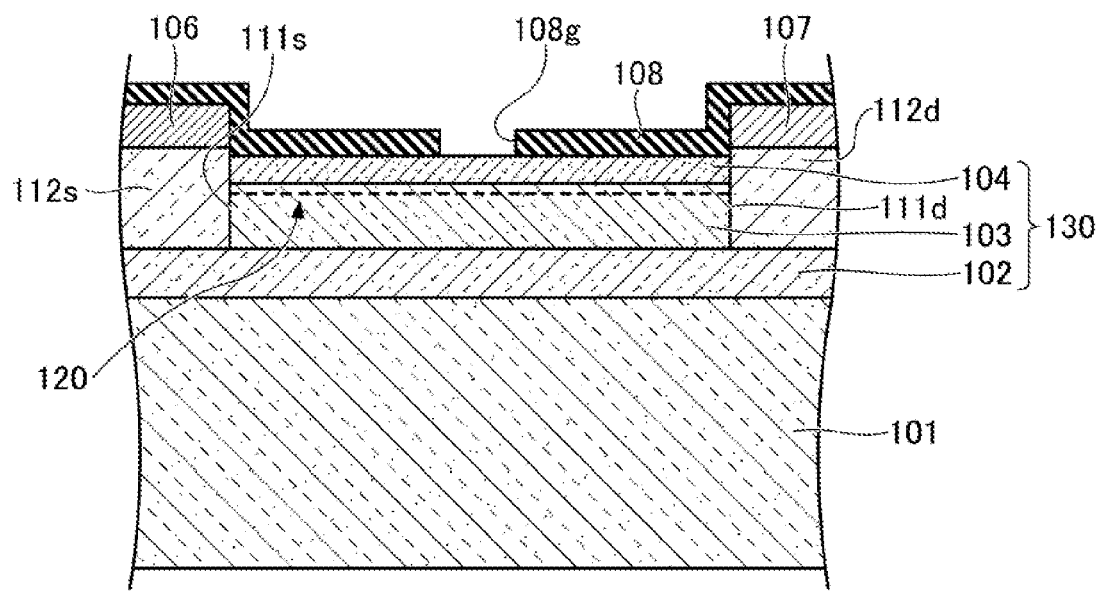
FIGS. 9A and 9B are cross-sectional views illustrating a step of the method of manufacturing a semiconductor device according to the first embodiment.

Then, as illustrated in FIG. 9A, an opening portion 108g is formed on the passivation film 108. In the formation of the opening portion 108g, for example, a photoresist pattern is formed by photolithography on the passivation film 108 to expose an area where the opening portion 108g is to be formed, and dry etching using a fluorine-based gas or a chlorine-based gas with the pattern as an etching mask is performed. Instead of dry etching, wet etching using fluoric acid or buffered fluoric acid or the like may be performed.

Figure 9B:
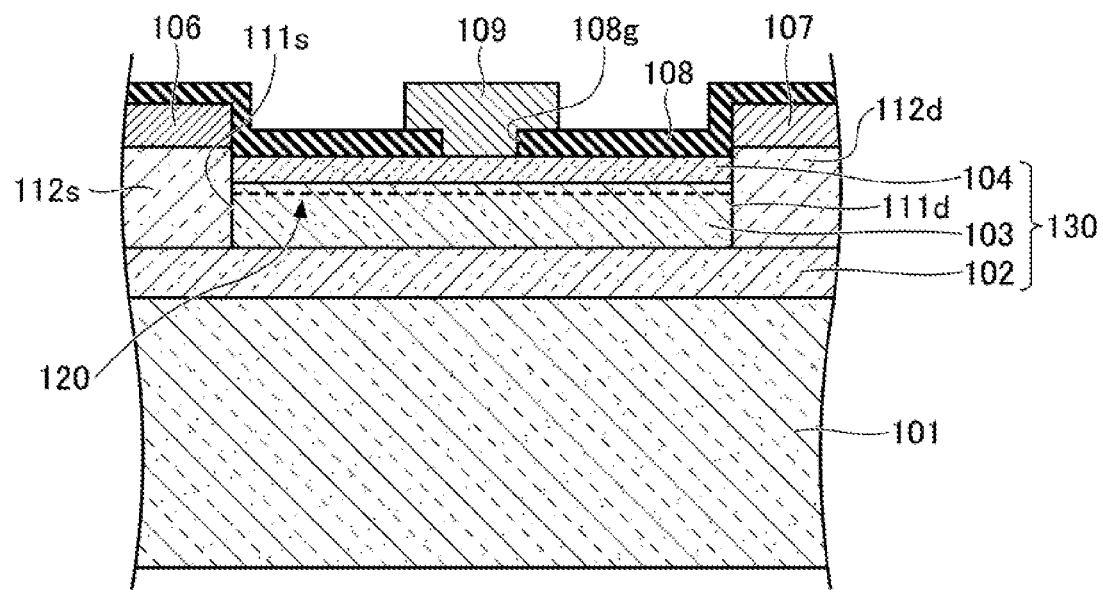

Then, as illustrated in FIG. 9B, a gate electrode 109 in contact with the barrier layer 104 through the opening portion 108g is formed on the passivation film 108. The gate electrode 109 can be formed, for example, by a lift-off process. That is, a photoresist pattern is formed to expose an area where the gate electrode 109 is to be formed, a metal film is formed with the pattern as a growth mask by a deposition process, and the pattern is removed together with the metal film thereon. In the formation of the metal film, for example, a Ni film is formed and an Au film is formed on the Ni film.

In this manner, the semiconductor device 100 according to the first embodiment can be manufactured.

It is not necessary to stop the dry etching at the upper surface of the buffer layer 102 when forming the opening portions 111s and 111d. Portions of the surficial layer portion of the buffer layer 102 may be over-etched so that the channel layer 103 does not remain at the bottom portions of the opening portions 111s and 111d. The portions of the buffer layer 102 below the contact layers 112s and 112d may be thinner than the portion below the channel layer 103.

The ratio (x1) of Al in the composition of the buffer layer 102 is preferably 0.20 or less, and is more preferably 0.10 or less. This is because if the ratio of Al in the composition is higher than 0.20, the difference between the lattice constant of the buffer layer 102 and the lattice constant of the contact layers 112s and 112d is large, and the surface roughness of the contact layers 112s and 112d may be large.

Figure 10:
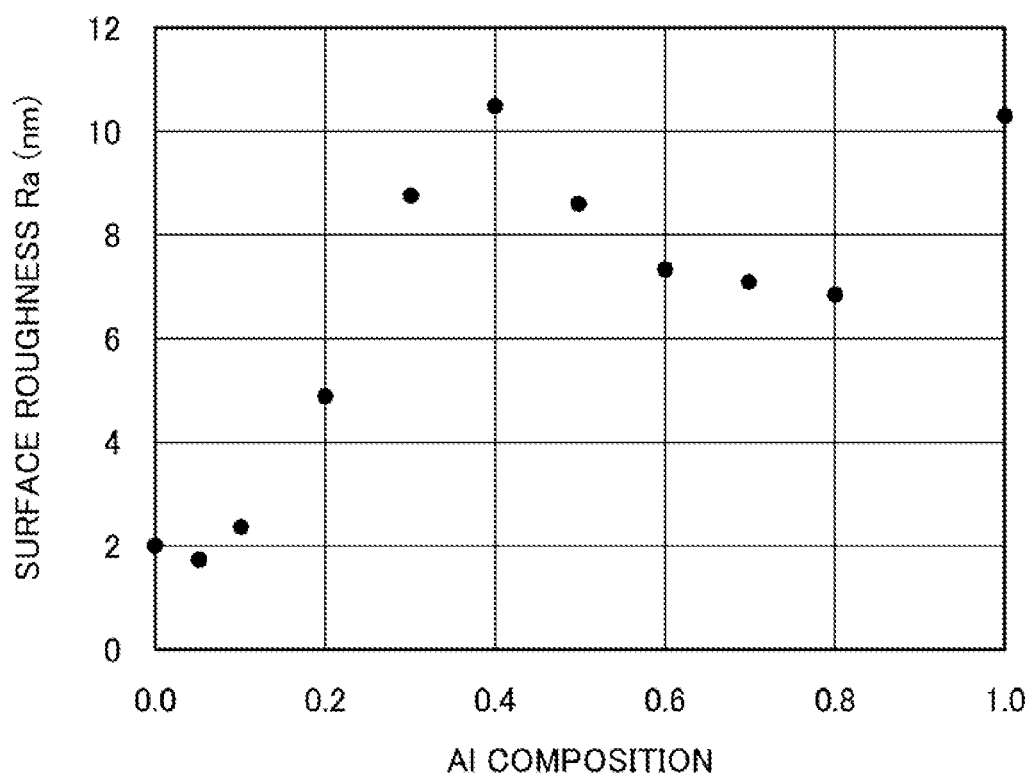
FIG. 10 is a diagram illustrating a relationship between a ratio (x1) of Al in the composition of an $Al_{x1}Ga_{1-x1}$ layer and a surface roughness Ra of an n-type GaN layer.

The test performed by the inventor of the present application will now be described. In this test, an n-type GaN layer having a thickness of 50 nm was grown on an $Al_{x1}Ga_{1-x1}N$ layer, and the surface roughness Ra of the n-type GaN layer was measured. The n-type GaN layer was grown at a temperature of 700° C. to 750° C. under a pressure of 20 kPa. FIG. 10 is a diagram illustrating a relationship between the ratio (x1) of Al in the composition of the $Al_{x1}Ga_{1-x1}$ layer and the surface roughness Ra of the n-type GaN layer. In FIG. 10, the horizontal axis indicates the ratio (x1) of Al in the composition of the $Al_{x1}Ga_{1-x1}$ layer and the vertical axis indicates the surface roughness Ra of the n-type GaN layer formed on the $Al_{x1}Ga_{1-x1}$ layer. As illustrated in FIG. 10, when the ratio (x1) of Al in the composition was less than or equal to 0.20, the surface roughness Ra of the n-type GaN layer was less than or equal to 5 nm, which was small. Also, when the ratio (x1) of Al in the composition was less than or equal to 0.10, the surface roughness Ra of the n-type GaN layer was less than or equal to 2.5 nm, which was smaller. When the surface roughness Ra is 5 nm or less, the electrical resistance of the n-type GaN layer in the direction parallel to the surface of the AlGaN layer is small enough to reduce the on resistance of the HEMT.

Modified Example

Figure 11:
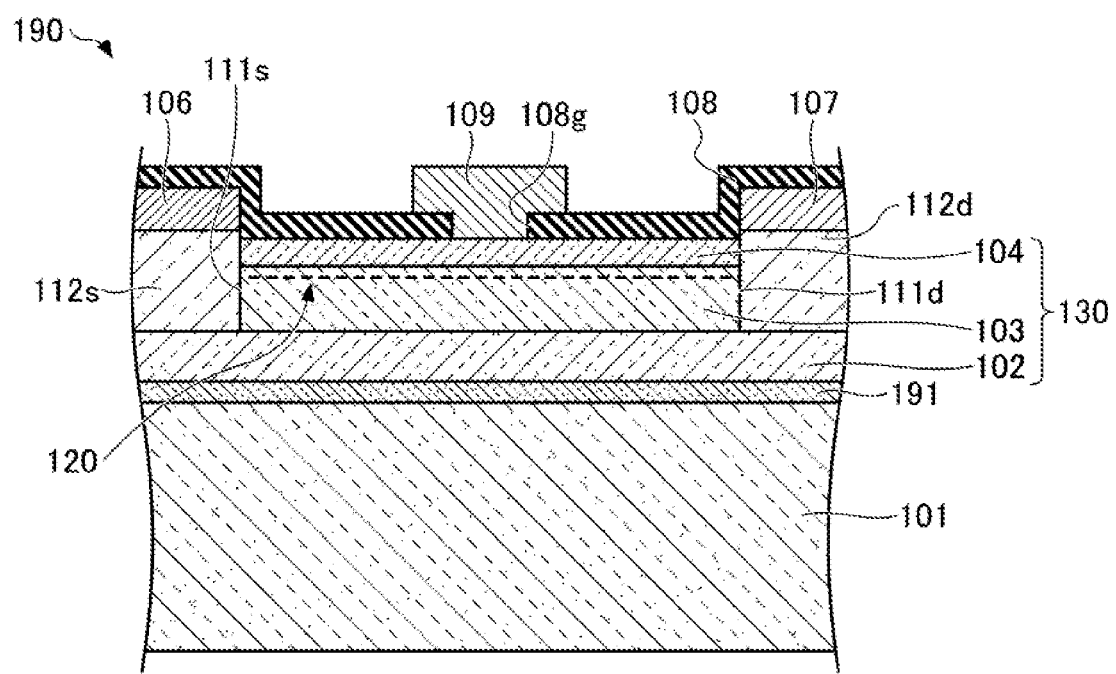
FIG. 11 is a cross-sectional view illustrating a semiconductor device according to a modified example of the first embodiment.

A nitride semiconductor layer may be included between the substrate 101 and the buffer layer 102. FIG. 11 is a cross-sectional view illustrating a semiconductor device 190 according to a modified example of the first embodiment.

In the semiconductor device 190 according to the modified example, an intermediate layer 191 is provided between the substrate 101 and the buffer layer 102 as illustrated in FIG. 11. The intermediate layer 191 is, for example, an AlN layer and the upper surface of the intermediate layer 191 is Al-polar. That is, the Miller index of the upper surface of the intermediate layer 191 is (0001). In the semiconductor device 190, the substrate 101 and the intermediate layer 191 are included in a base. The intermediate layer 191 is an example of a third layer, and AlN of the intermediate layer 191 is an example of a sixth nitride semiconductor. The composition of the intermediate layer 191 is not limited to AlN, and may be, for example, AlGaN having a higher ratio of Al in the composition than that of the buffer layer 102.

Second Embodiment

Figure 12:
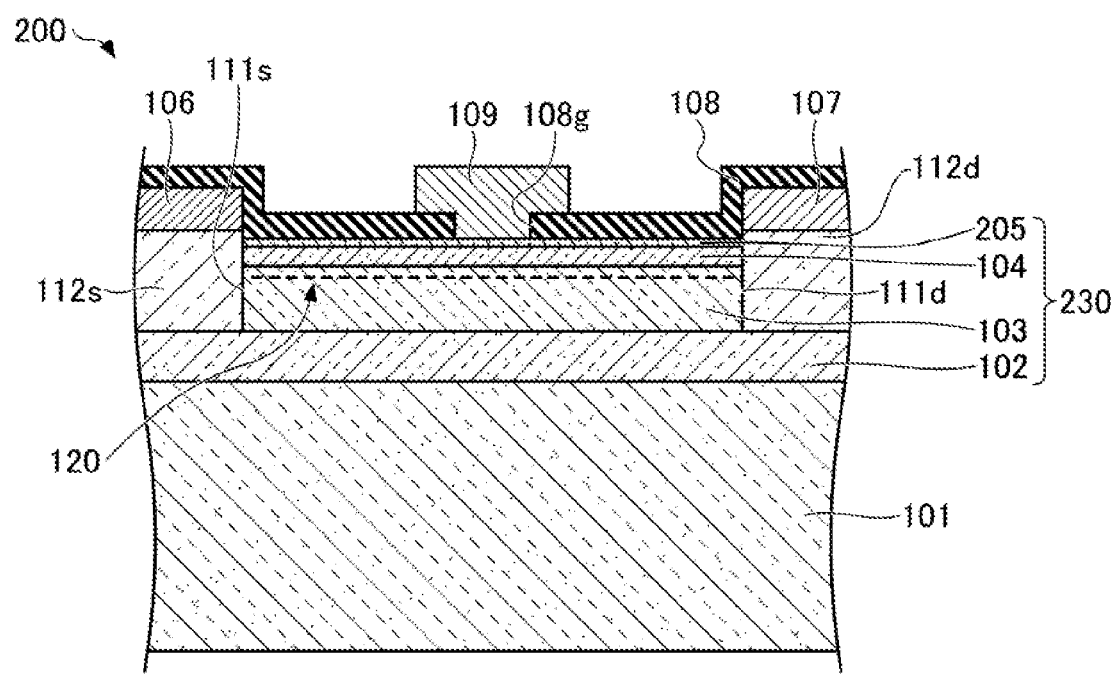
FIG. 12 is a cross-sectional view illustrating a semiconductor device according to a second embodiment.

A second embodiment will be described. The second embodiment relates to a semiconductor device including a HEMT having a quantum confinement structure. FIG. 12 is a cross-sectional view illustrating a semiconductor device 200 according to the second embodiment.

In the semiconductor device 200 according to the second embodiment, a nitride semiconductor layered structure 230 is formed over a substrate 101 as illustrated in FIG. 12. The nitride semiconductor layered structure 230 includes a buffer layer 102, a channel layer 103, a barrier layer 104, and a cap layer 205. The buffer layer 102 is formed on the substrate 101. The channel layer 103 is formed on the buffer layer 102. The barrier layer 104 is formed on the channel layer 103. The cap layer 205 is formed on the barrier layer 104.

The cap layer 205 is, for example, a GaN layer having a thickness of 1 nm to 5 nm. The opening portions 111s and 111d are formed in the cap layer 205, the barrier layer 104, and the channel layer 103. A passivation film 108 is formed over the cap layer 205. The gate electrode 109 is in contact with the cap layer 205. The Miller index of the upper surface of the cap layer 205 is also (0001).

Other configurations of the second embodiment are similar to those of the first embodiment.

Effects similar to those of the first embodiment can also be obtained by the second embodiment. Also, because the cap layer 205 is formed, an electric field spreading from the end portion of the gate electrode 109 on the drain electrode 107 side toward the 2DEG 120 can be alleviated. Further, because the cap layer 205 is formed, separation of In or the like from the barrier layer 104 can be suppressed.

Next, a method of manufacturing the semiconductor device 200 according to the second embodiment will be described. FIG. 13 to FIG. 16 are cross-sectional views illustrating the method of manufacturing the semiconductor device 200 according to the second embodiment.

Figure 13A:
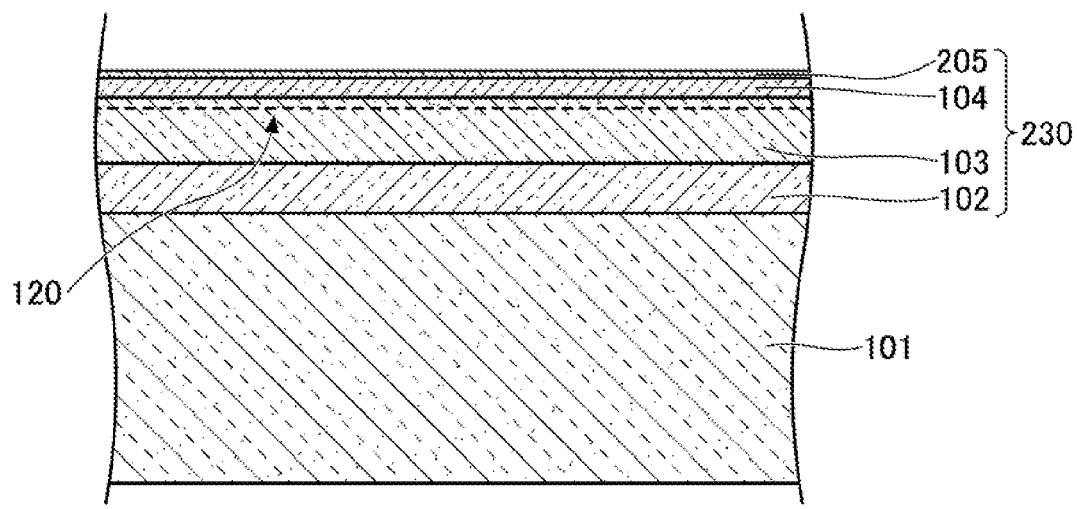
FIGS. 13A and 13B are cross-sectional views illustrating a step of a method of manufacturing a semiconductor device according to the second embodiment.

First, as illustrated in FIG. 13A, a nitride semiconductor layered structure 230 is formed on the (0001) surface of a substrate 101. In the formation of the nitride semiconductor layered structure 230, a buffer layer 102, a channel layer 103, a barrier layer 104, and a cap layer 205 are formed by, for example, MOVPE. When forming the nitride semiconductor layered structure 230, for example, as a material gas, a mix gas of a TMAl gas, a TMGa gas, a TMIn gas, and an $NH_3$ gas is used. A $H_2$ gas or a $N_2$ gas is used as the carrier gas. Depending on the composition of nitride semiconductor layers to be grown, whether to supply or not the TMAl gas, the TMGa gas, and the TMIn gas and their flow rates are set as appropriate. For example, the growth pressure is approximately 1 kPa to 100 kPa and the growth temperature is approximately 600° C. to 1500° C. The formation of the barrier layer 104 generates a 2DEG 120 near the upper surface of the channel layer 103.

Figure 13B:
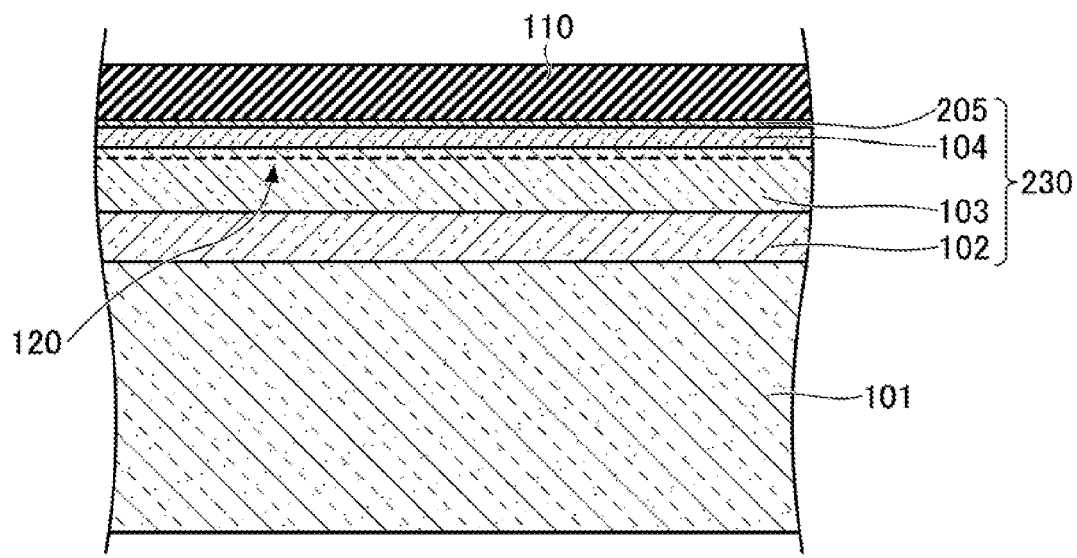
Figure 14A:
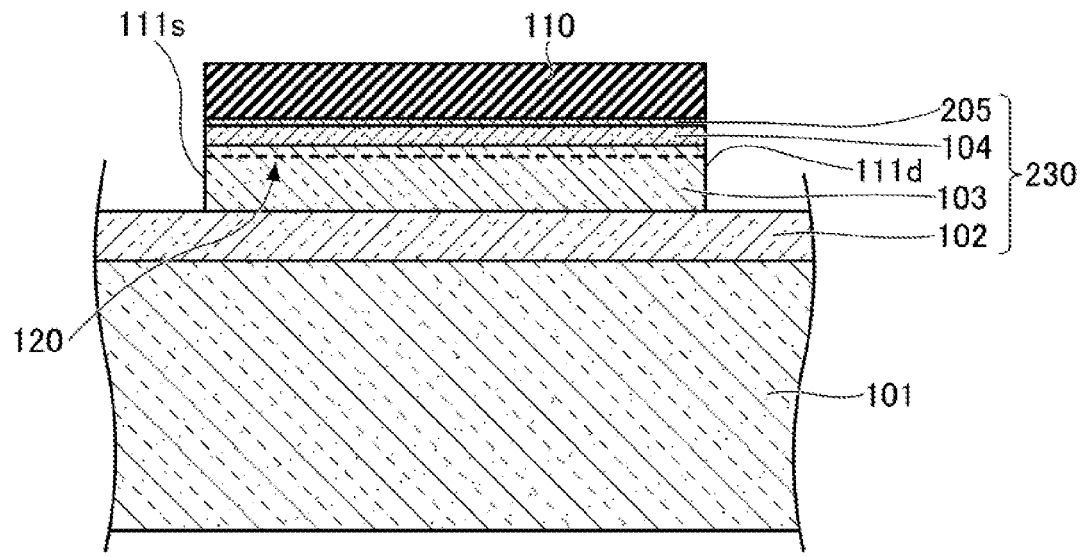
FIGS. 14A and 14B are cross-sectional views illustrating a step of the method of manufacturing a semiconductor device according to the second embodiment.

A surface protective film 110 is then formed on the cap layer 205, as illustrated in FIG. 13B. Thereafter, on the surface protective film 110, the cap layer 205, the barrier layer 104, and the channel layer 103, an opening portion 111s for source and an opening portion 111d for drain are formed, as illustrated in FIG. 14A.

Figure 14B:
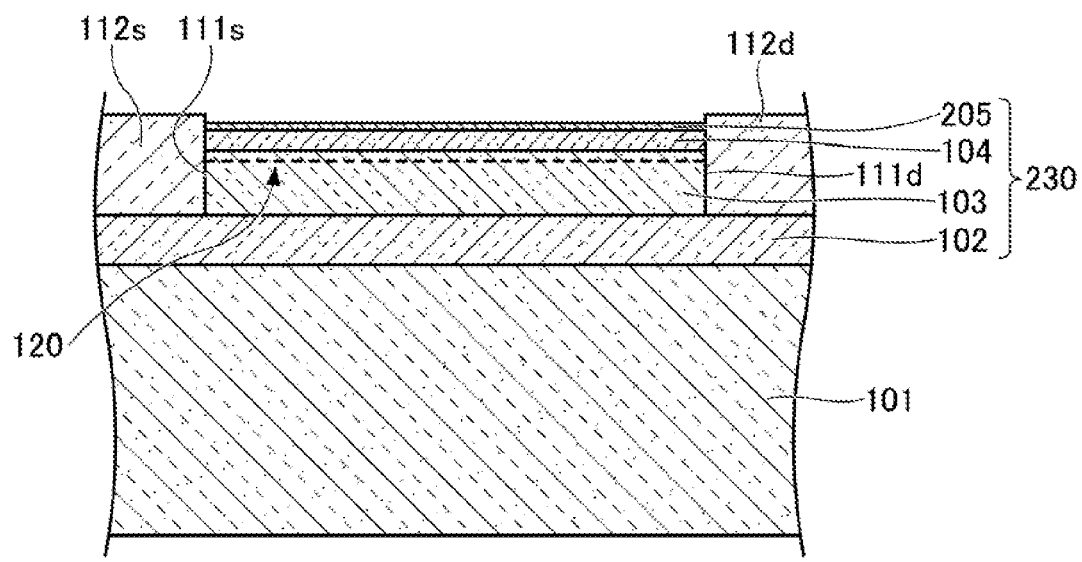

Subsequently, as illustrated in FIG. 14B, a contact layer 112s is formed in the opening portion 111s and a contact layer 112d is formed in the opening portion 111d. After the contact layers 112s and 112d are formed, the surface protective film 110 is removed. The upper surfaces of the contact layers 112s and 112d may be above the upper surface of the cap layer 205, may be flush with the upper surface of the cap layer 205, or may be below the upper surface of the cap layer 205.

Figure 15A:
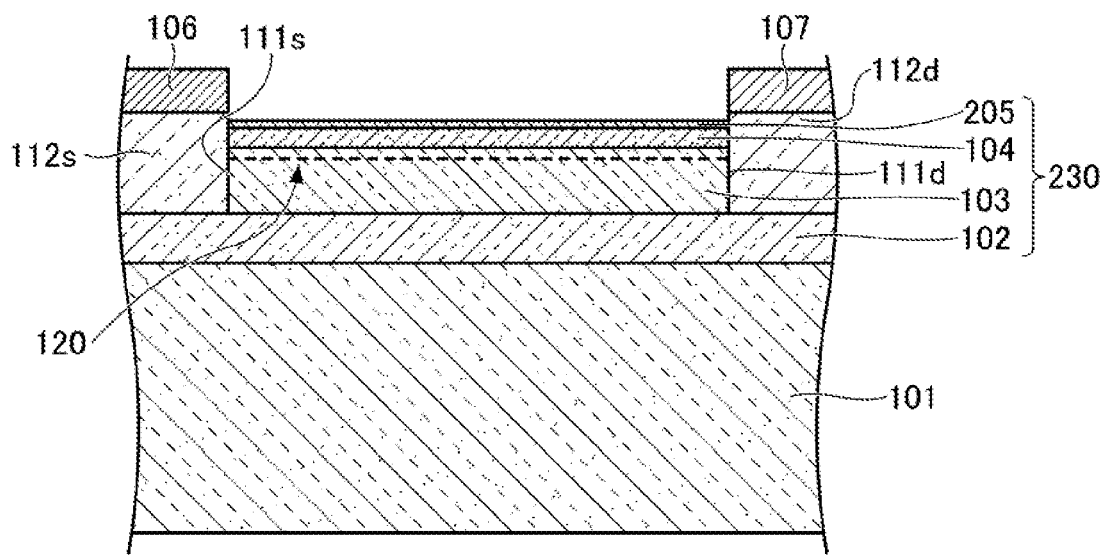
FIGS. 15A and 15B are cross-sectional views illustrating a step of the method of manufacturing a semiconductor device according to the second embodiment.
Figure 15B:
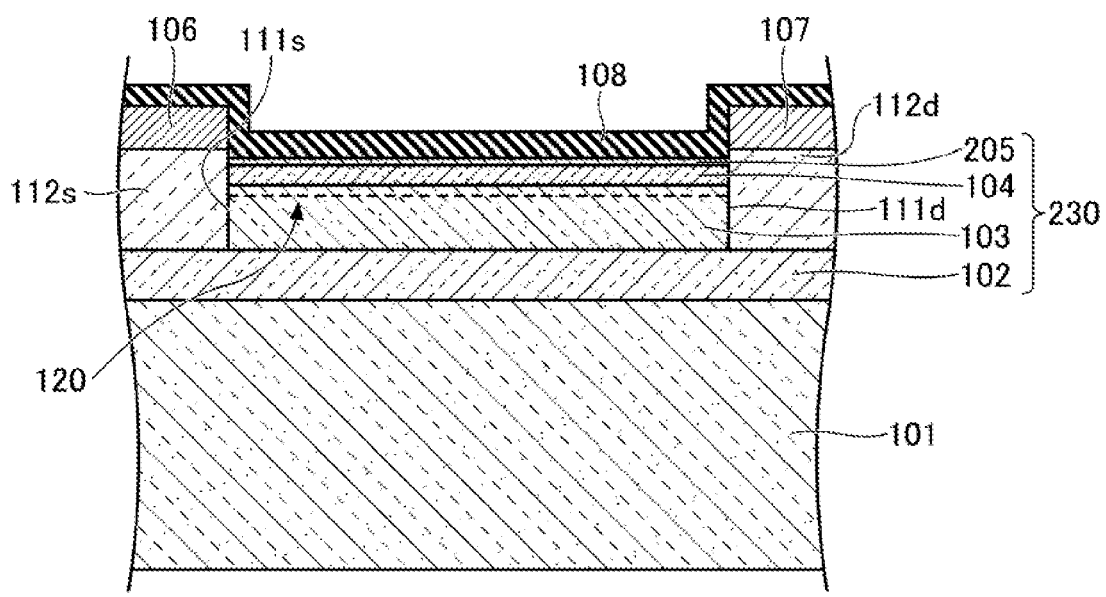

Then, in the nitride semiconductor layered structure 230, an element isolation area that defines an element area is formed. Then, as illustrated in FIG. 15A, a source electrode 106 is formed on the contact layer 112s and a drain electrode 107 is formed on the contact layer 112d. Then, for example, a heat treatment is performed in a nitrogen atmosphere to establish ohmic characteristics. Then, as illustrated in FIG. 15B, a passivation film 108 is formed over the cap layer 205 to cover the source electrode 106 and the drain electrode 107.

Figure 16A:
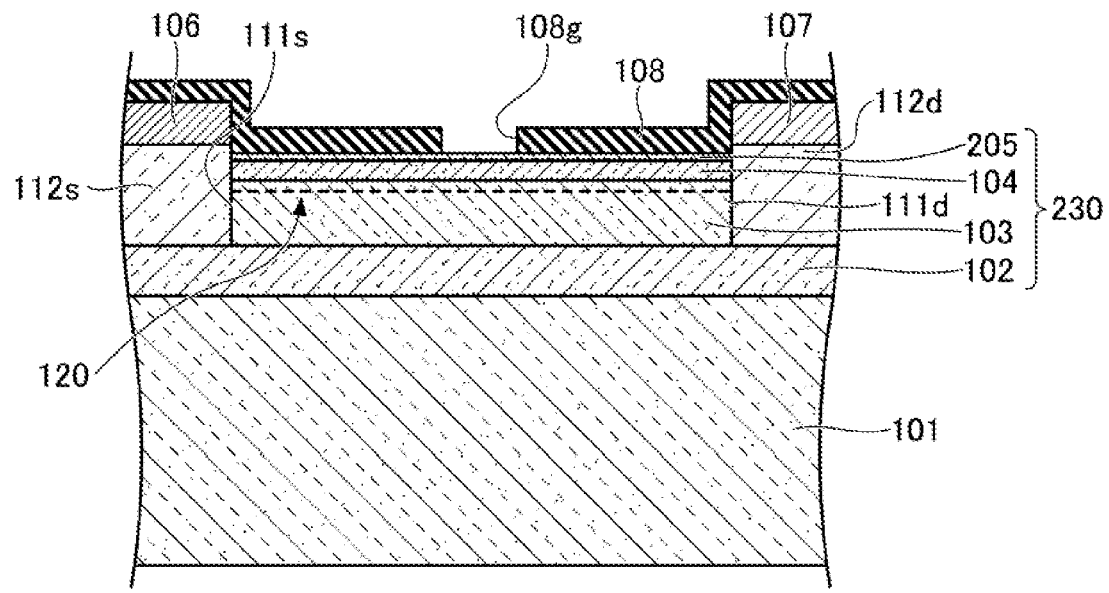
FIGS. 16A and 16B are cross-sectional views illustrating a step of the method of manufacturing a semiconductor device according to the second embodiment.
Figure 16B:
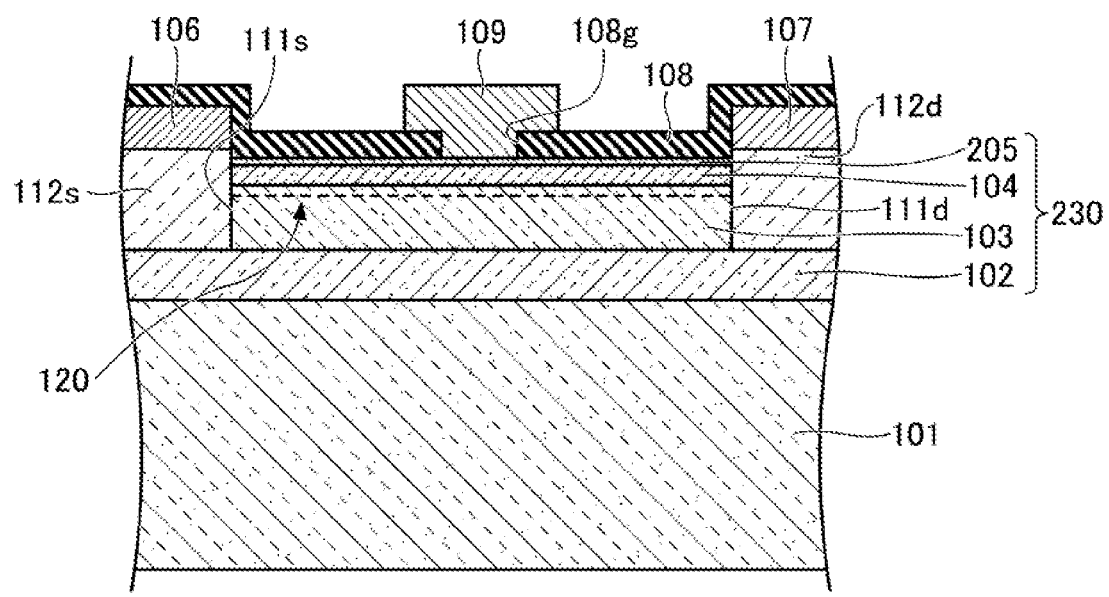

Then, as illustrated in FIG. 16A, an opening portion 108g is formed on the passivation film 108. Then, as illustrated in FIG. 16B, a gate electrode 109 in contact with the cap layer 205 through the opening portion 108g is formed on the passivation film 108.

In this manner, the semiconductor device 200 according to the second embodiment can be manufactured.

Third Embodiment

Figure 17:
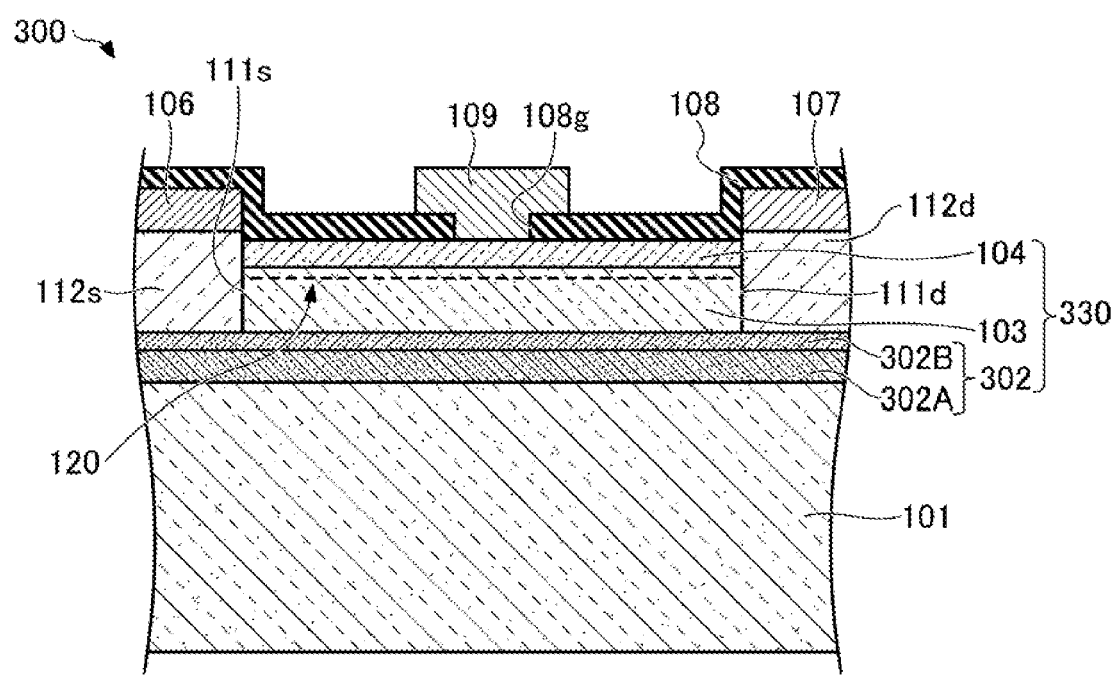
FIG. 17 is a cross-sectional view illustrating a semiconductor device according to a third embodiment.

A third embodiment will be described. The third embodiment relates to a semiconductor device including a HEMT having a quantum confinement structure. FIG. 17 is a cross-sectional view illustrating a semiconductor device 300 according to the third embodiment.

In the semiconductor device 300 according to the third embodiment, a nitride semiconductor layered structure 330 is formed over the substrate 101, as illustrated in FIG. 17. The nitride semiconductor layered structure 330 includes a buffer layer 302, a channel layer 103, and a barrier layer 104. The buffer layer 302 is formed on the substrate 101. The channel layer 103 is formed on the buffer layer 302. The barrier layer 104 is formed on the channel layer 103.

The buffer layer 302 includes a first layer 302A formed on the substrate 101 and a second layer 302B formed on the first layer 302A. The first layer 302A is, for example, an $Al_{x3}Ga_{1-x3}N$ layer (0.00<x3<1.00) with a thickness of 25 nm to 80 nm. The second layer 302B is, for example, an $Al_{x4}Ga_{1-x4}N$ layer (0.00≤x4≤0.20, x4<x3) with a thickness of 5 nm to 20 nm. That is, the ratio of Al in the composition (x4) of the second layer 302B is lower than the ratio of Al in the composition (x3) of the first layer 302A. The thickness of the buffer layer 302 is preferably 100 nm or less and is more preferably 50 nm or less. This is for reducing the thermal resistance of the buffer layer 302. The Miller index of the upper surface of each of the first layer 302A and the second layer 302B is also (0001).

Other configurations of the third embodiment are similar to those of the first embodiment.

Effects similar to those of the first embodiment can also be obtained by the third embodiment. In addition, because the buffer layer 302 includes the first layer 302A and the second layer 302B having compositions different from each other, while suppressing the difference between the lattice constant of the substrate 101 and the lattice constant of the first layer 302A, the difference between the lattice constant of the second layer 302B and the lattice constant of the contact layers 112s and 112d can be suppressed.

It should be noted that the number of nitride semiconductor layers included in the buffer layer 302 may be three or more. The ratio of Al in the composition of the buffer layer 302 may be continuously lowered from the bottom surface to the top surface. In any structure, it is preferable that the ratio of Al in the composition on the surface of the buffer layer 302 in contact with the contact layers 112s and 112d is 0.20 or less. This is because if the ratio of Al in the composition is higher than 0.20, the difference between the lattice constant of the buffer layer 302 and the lattice constant of the contact layers 112s and 112d is large, and the surface roughness of the contact layers 112s and 112d may be large.

Next, a method of manufacturing the semiconductor device 300 according to the third embodiment will be described. FIG. 18 to FIG. 20 are cross-sectional views illustrating the method of manufacturing the semiconductor device 300 according to the third embodiment.

Figure 18A:
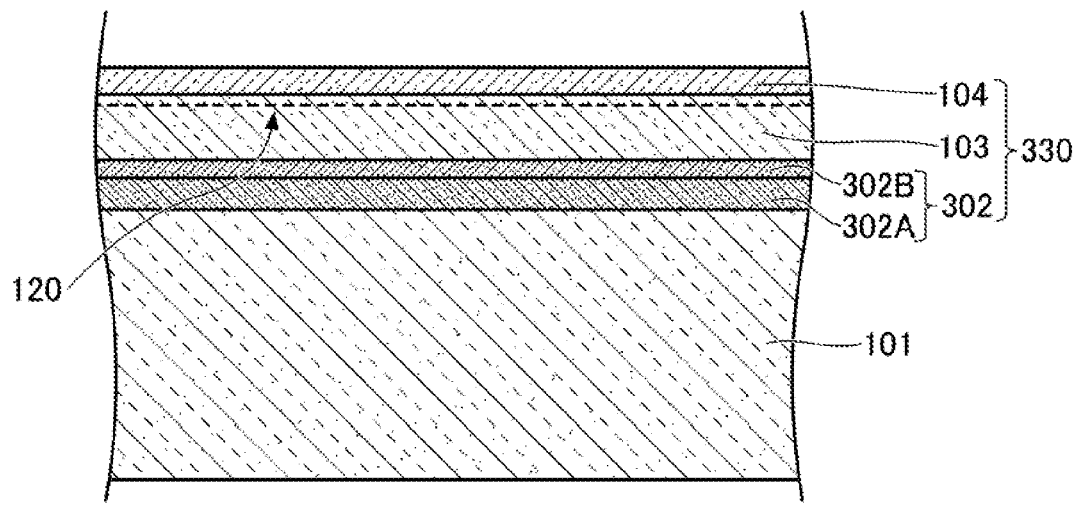
FIGS. 18A and 18B are cross-sectional views illustrating a step of a method of manufacturing a semiconductor device according to the third embodiment.

First, as illustrated in FIG. 18A, a nitride semiconductor layered structure 330 is formed on the (0001) surface of a substrate 101. In the formation of the nitride semiconductor layered structure 330, a first layer 302A, a second layer 302B, a channel layer 103, and a barrier layer 104 are formed by, for example, MOVPE. When forming the nitride semiconductor layered structure 330, for example, as a material gas, a mix gas of a TMAl gas, a TMGa gas, a TMIn gas, and an $NH_3$ gas is used. A $H_2$ gas or a $N_2$ gas is used as the carrier gas. Depending on the composition of nitride semiconductor layers to be grown, whether to supply or not the TMAl gas, the TMGa gas, and the TMIn gas and their flow rates are set as appropriate. For example, the growth pressure is approximately 1 kPa to 100 kPa and the growth temperature is approximately 600° C. to 1500° C. The formation of the barrier layer 104 generates a 2DEG 120 near the upper surface of the channel layer 103.

Figure 18B:
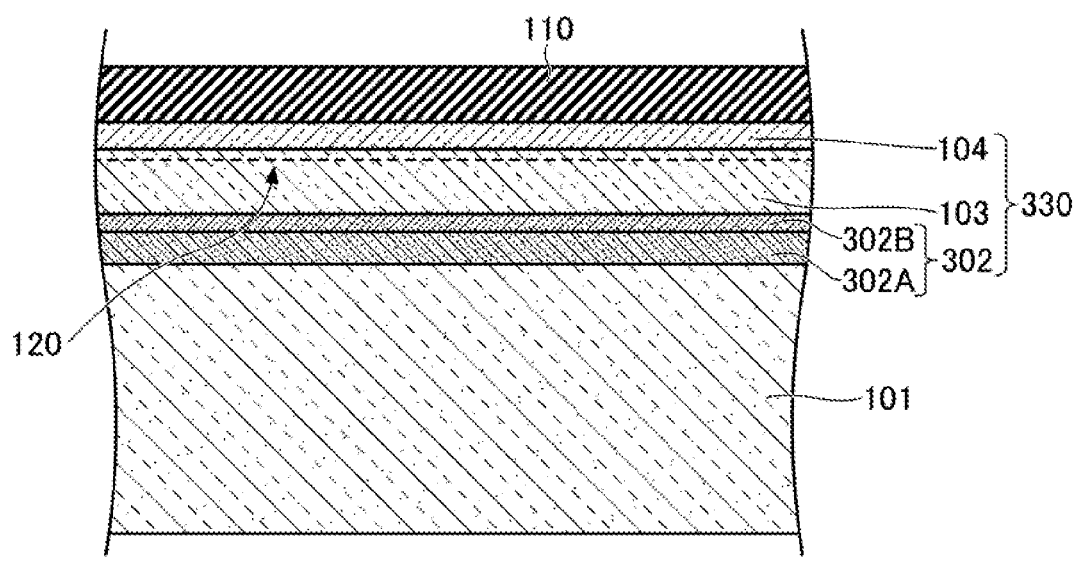
Figure 19A:
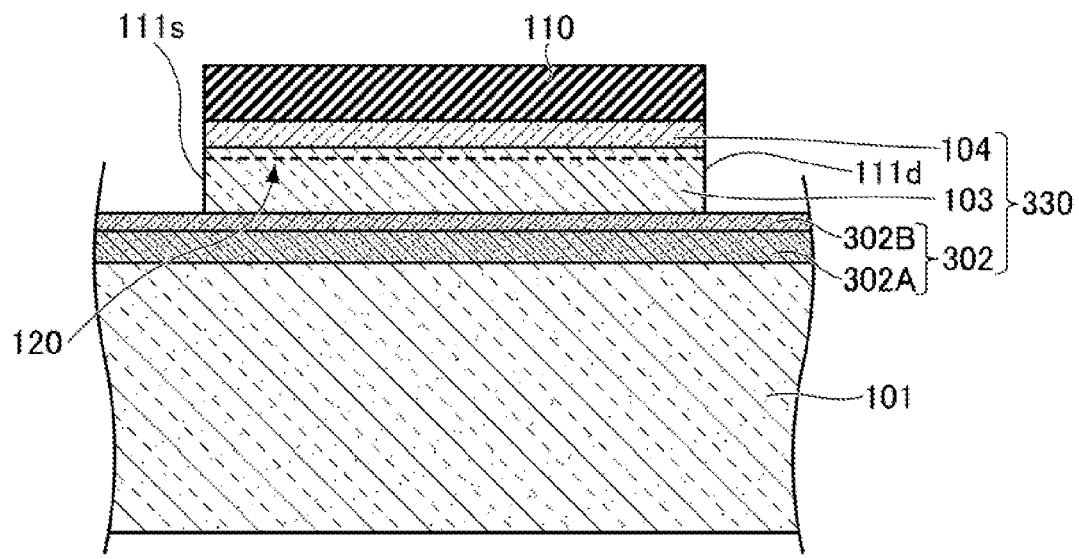
FIGS. 19A and 19B are cross-sectional views illustrating a step of the method of manufacturing a semiconductor device according to the third embodiment.

A surface protective film 110 is then formed on the barrier layer 104, as illustrated in FIG. 18B. Thereafter, on the surface protective film 110, the barrier layer 104, and the channel layer 103, an opening portion 111s for source and an opening portion 111d for drain are formed, as illustrated in FIG. 19A.

Figure 19B:
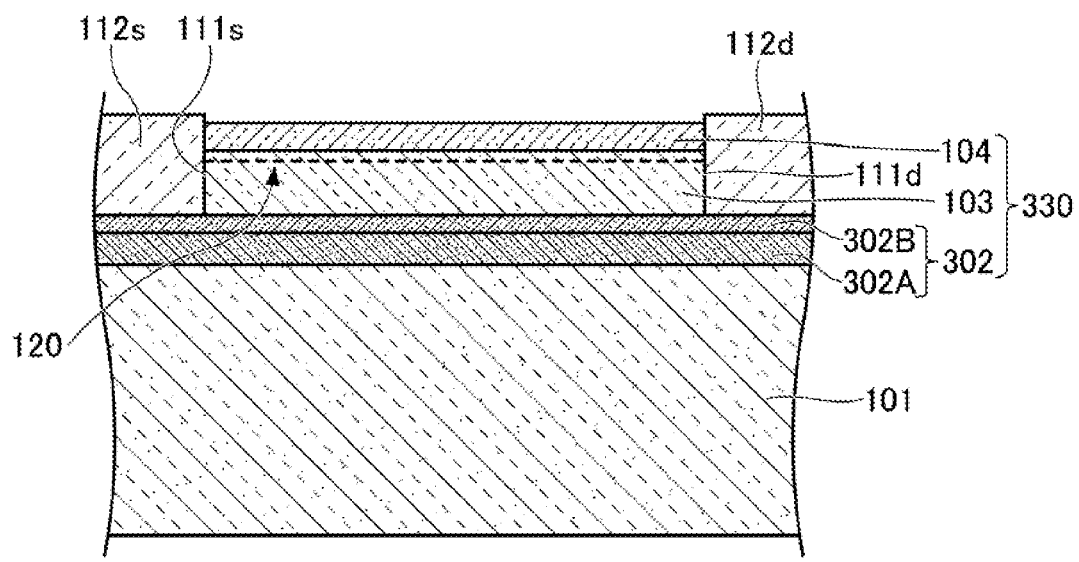

Subsequently, as illustrated in FIG. 19B, a contact layer 112s is formed in the opening portion 111s and a contact layer 112d is formed in the opening portion 111d. After the contact layers 112s and 112d are formed, the surface protective film 110 is removed. It is not necessary to stop dry etching at the upper surface of the buffer layer 302 when forming the opening portions 111s and 111d. Portions of the surficial layer portion of the buffer layer 302 may be over-etched so that the channel layer 103 does not remain at the bottom portions of the opening portions 111s and 111d. The portions of the buffer layer 302 below the contact layers 112s and 112d may be thinner than the portion below the channel layer 103.

Figure 20A:
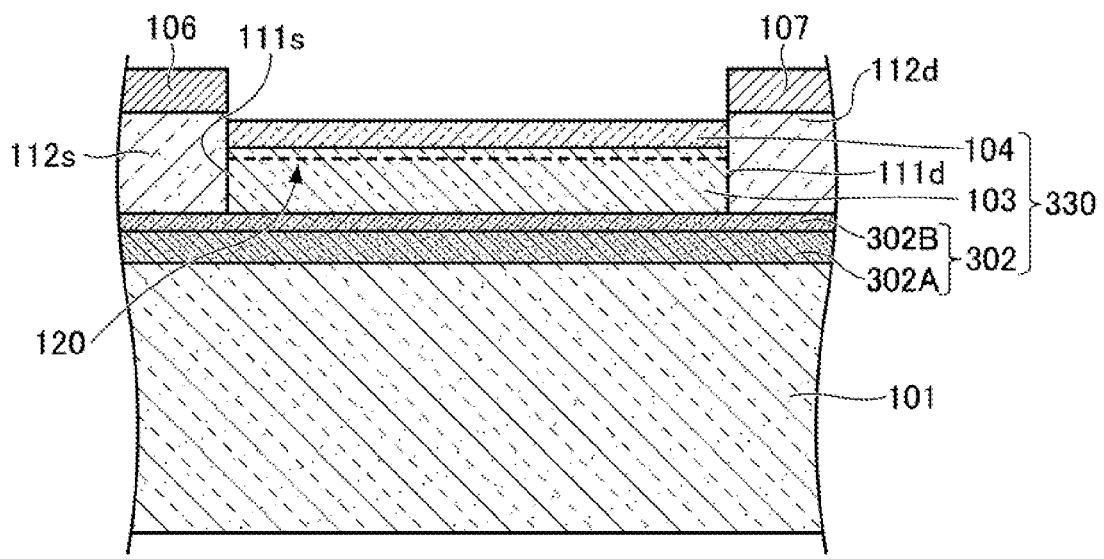
FIGS. 20A and 20B are cross-sectional views illustrating a step of the method of manufacturing a semiconductor device according to the third embodiment.
Figure 20B:
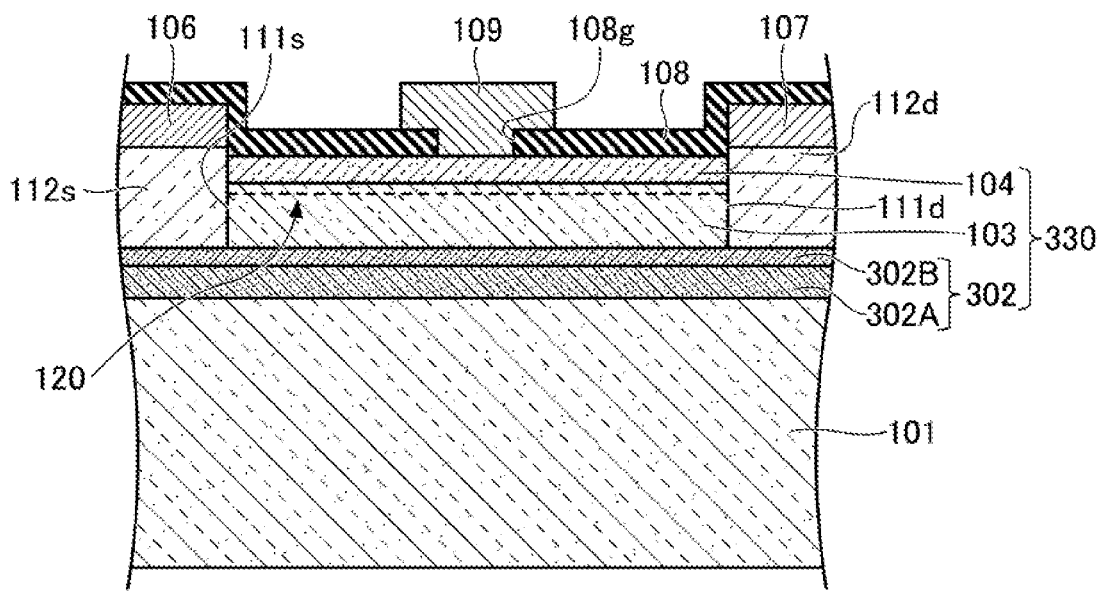

Then, in the nitride semiconductor layered structure 330, an element isolation area that defines an element area is formed. Then, as illustrated in FIG. 20A, a source electrode 106 is formed on the contact layer 112s and a drain electrode 107 is formed on the contact layer 112d. Then, for example, a heat treatment is performed in a nitrogen atmosphere to establish ohmic characteristics. Subsequently, as illustrated in FIG. 20B, the process as of the formation of a passivation film 108 is performed similarly to the first embodiment.

In this manner, the semiconductor device 300 according to the third embodiment can be manufactured.

Fourth Embodiment

Figure 21:
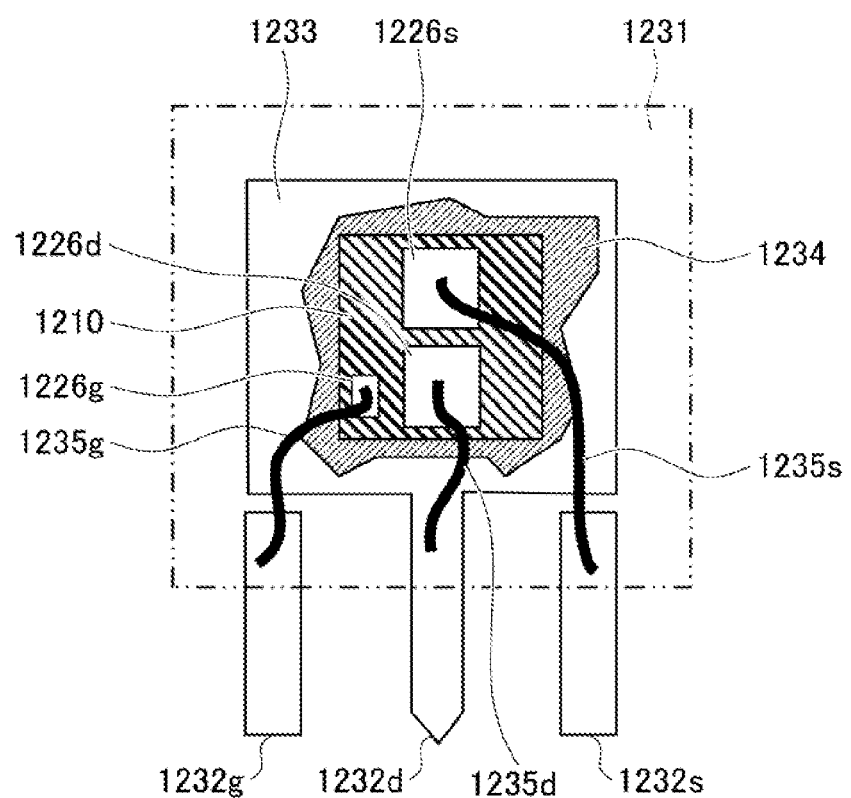
FIG. 21 is a diagram illustrating a discrete package according to a fourth embodiment.

Next, a fourth embodiment will be described. The fourth embodiment relates to a discrete package of a HEMT. FIG. 21 is a diagram illustrating a discrete package according to the fourth embodiment.

In the fourth embodiment, as illustrated in FIG. 21, a back surface of a semiconductor device 1210 having the same structure as any of the first to third embodiments is secured to a land (die pad) 1233 with a die attach material 1234, such as solder. One end of a wire 1235d, such as an Al wire, is connected to a drain pad 1226d to which the drain electrode 107 is connected, and the other end of the wire 1235d is connected to a drain lead 1232d integral with the land 1233. One end of a wire 1235s, such as Al wire, is connected to a source pad 1226s to which the source electrode 106 is connected, and the other end of the wire 1235s is connected to a source lead 1232s independent of the land 1233. One end of a wire 1235g, such as Al wire, is connected to a gate pad 1226g to which the gate electrode 111 is connected, and the other end of the wire 1235g is connected to a gate lead 1232g independent of the land 1233. The land 1233 and the semiconductor device 1210 are then packaged with a mold resin 1231 so that a portion of the gate lead 1232g, a portion of the drain lead 1232d, and a portion of the source lead 1232s protrude.

Such a discrete package may be fabricated, for example, as follows. First, the semiconductor device 1210 is secured to the land 1233 of a lead frame using the die attach material 1234, such as solder. The gate pad 1226g is then connected to the gate lead 1232g of the lead frame by bonding using wires 1235g, 1235d and 1235s, the drain pad 1226d is connected to the drain lead 1232d of the lead frame, and the source pad 1226s is connected to the source lead 1232s of the lead frame. Thereafter, a transfer mold process is performed using a mold resin 1231 for sealing. The lead frame is then disconnected.

Fifth Embodiment

Figure 22:
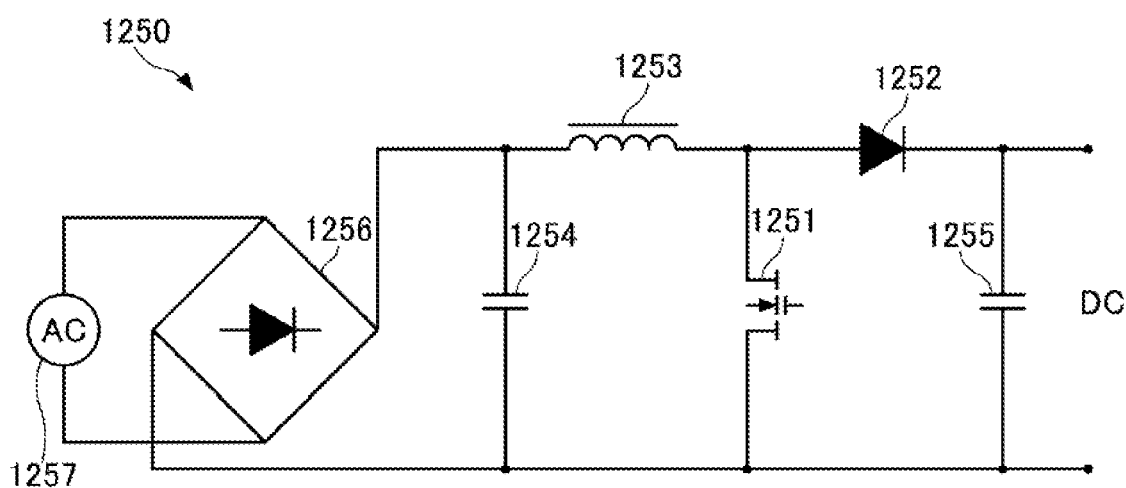
FIG. 22 is a line diagram illustrating a PFC circuit according to a fifth embodiment.

Next, a fifth embodiment will be described. A fifth embodiment relates to a PFC (Power Factor Correction) circuit with a HEMT. FIG. 22 is a line diagram illustrating a PFC circuit 1250 according to the fifth embodiment.

The PFC circuit 1250 is provided with a switch element (transistor) 1251, a diode 1252, a choke coil 1253, capacitors 1254 and 1255, a diode bridge 1256, and an AC power supply (AC) 1257. A drain electrode of the switch element 1251 is connected to an anode terminal of the diode 1252 and one terminal of the choke coil 1253. A source electrode of the switch element 1251 is connected to one terminal of the capacitor 1254 and one terminal of the capacitor 1255. The other terminal of the capacitor 1254 is connected to the other terminal of the choke coil 1253. The other terminal of the capacitor 1255 is connected to a cathode terminal of the diode 1252. A gate driver is also connected to the gate electrode of the switch element 1251. The AC 1257 is connected between the terminals of the capacitor 1254 via the diode bridge 1256. A DC power supply (DC) is connected between the terminals of the capacitor 1255. In the present embodiment, for the switch element 1251, a semiconductor device having the same structure as any of the first to third embodiments is used.

When the PFC circuit 1250 is manufactured, for example, solder or the like is used to connect the switch element 1251 to the diode 1252, the choke coil 1253, and the like.

Sixth Embodiment

Figure 23:
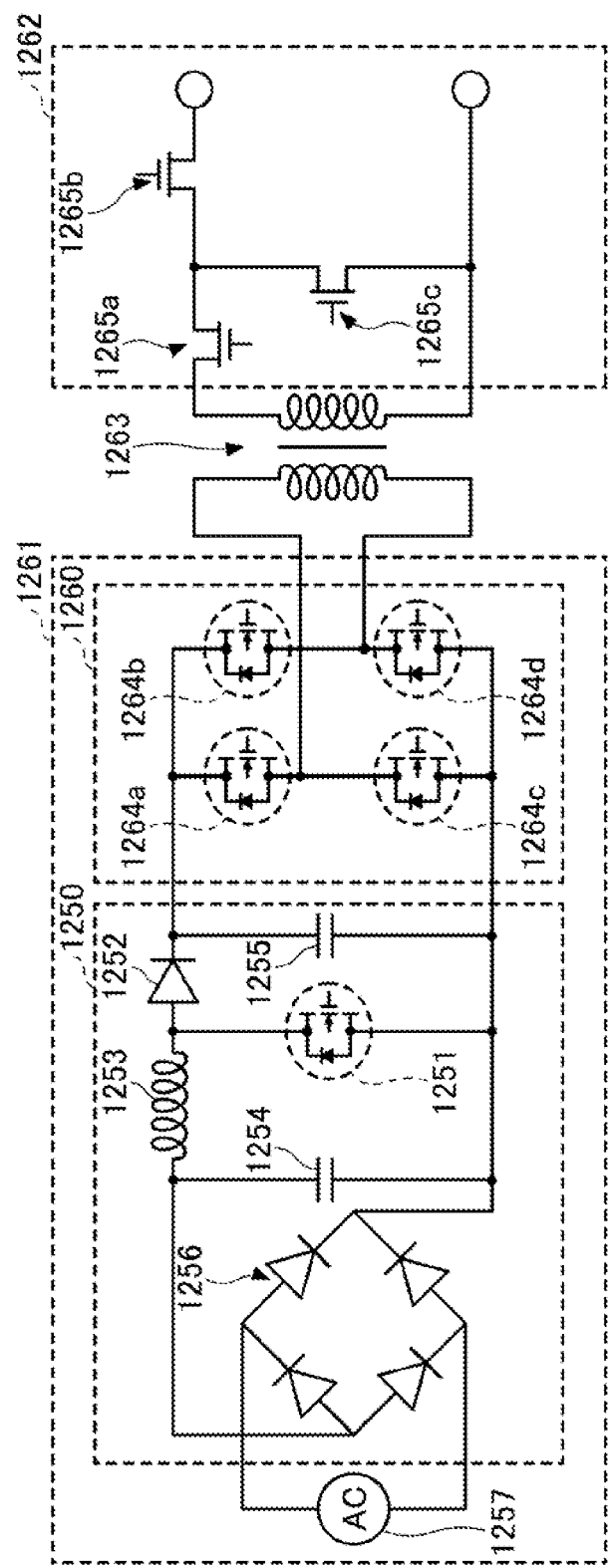
FIG. 23 is a line diagram illustrating a power supply apparatus according to a sixth embodiment.

Next, a sixth embodiment will be described. The six embodiment relates to a power supply apparatus having a HEMT suitable for server power supply. FIG. 23 is a line diagram illustrating a power supply apparatus according to the sixth embodiment.

The power supply apparatus is provided with a high voltage primary circuit 1261, a low voltage secondary circuit 1262, and a transformer 1263 disposed between the primary circuit 1261 and the secondary circuit 1262.

The primary circuit 1261 is provided with a PFC circuit 1250 according to the fifth embodiment and an inverter circuit, such as a full bridge inverter circuit 1260, which is connected between the terminals of the capacitor 1255 of the PFC circuit 1250. The full bridge inverter circuit 1260 is provided with a plurality (four, in this example) of switch elements 1264a, 1264b, 1264c and 1264d.

The secondary circuit 1262 is provided with a plurality (three, in this example) of switch elements 1265a, 1265b and 1265c.

In the present embodiment, a semiconductor device having the same structure as in any of the first to third embodiments is used for the switch element 1251 of the PFC circuit 1250, and the switch elements 1264a, 1264b, 1264c, and 1264d of the full bridge inverter circuit 1260, which form the primary circuit 1261. Conversely, a related art MIS-type FET (field effect transistor) using silicon is used for the switch elements 1265*a*, 1265*b* and 1265*c* of the secondary circuit 1262.

Seventh Embodiment

Figure 24:
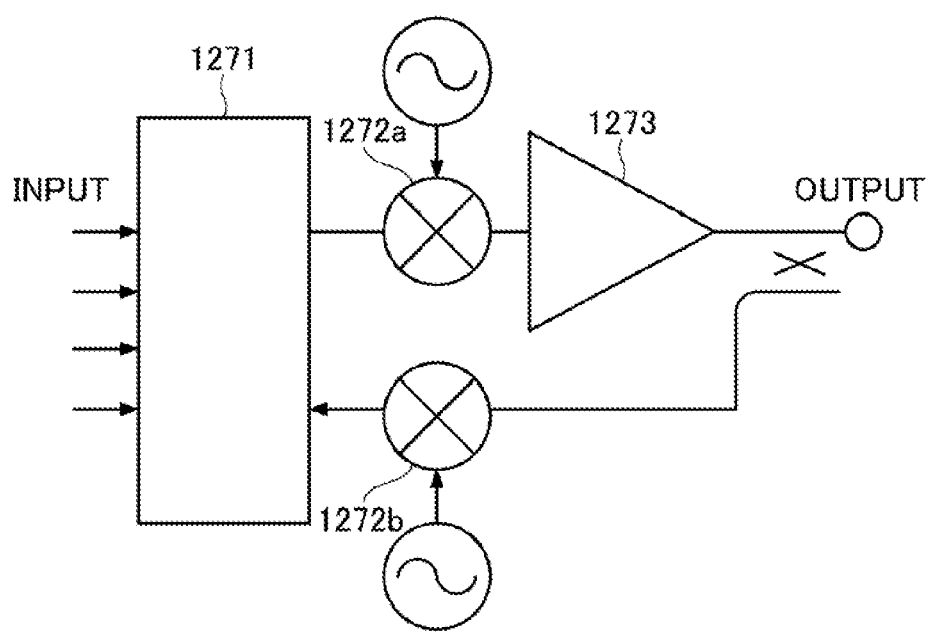
FIG. 24 is a line diagram illustrating an amplifier according to a seventh embodiment.

Next, a seventh embodiment will be described. The seventh embodiment relates to an amplifier having a HEMT. FIG. 24 is a line diagram illustrating an amplifier according to the seventh embodiment.

The amplifier is provided with a digital pre-distortion circuit 1271, mixers 1272*a* and 1272*b*, and a power amplifier 1273.

The digital pre-distortion circuit 1271 compensates for a nonlinear strain of an input signal. The mixer 1272*a* mixes the non-linear strain compensated input signal and an AC signal. The power amplifier 1273 includes a semiconductor device having the same structure as any of the first to third embodiments to amplify an input signal mixed with an AC signal. In the present embodiment, for example, by switching the switching elements, an output signal can be mixed with an AC signal by the mixer 1272*b*, and the mixed signal can be transmitted to the digital pre-distortion circuit 1271. The amplifier can be used as a high-frequency amplifier, or a high-power amplifier. The high-frequency amplifier can be used, for example, in a transceiver for a mobile phone base station, a radar device, and a microwave generator.

If an intermediate layer 191 is provided to serve as a base as in the modified example of the first embodiment, the used substrate may be a silicon carbide (SiC) substrate, a sapphire substrate, a silicon substrate, an AlN substrate, a GaN substrate, or a diamond substrate. The substrate may be electrically conductive, semi-insulating, or insulating.

The structures of the gate electrode and the drain electrode are not limited to those of the embodiments described above. For example, the electrodes may be composed of a single layer. Also, the method of forming these electrodes are not limited to a lift-off process. Further, if ohmic characteristics can be obtained, a heat treatment after the forming of the source electrode and the drain electrode may be omitted. A heat treatment may be performed after the formation of the gate electrode.

As the structure of a gate electrode, although a Schottky type gate structure is used in the embodiments described above, a MIS (metal-insulator-semiconductor) type gate structure may be used.

Preferred embodiments have been described in detail above. However, various alterations and substitutions may be added to the embodiments described above, without being limited to the embodiments described above and without departing from the scope described in claims.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a base of a first nitride semiconductor;
   a buffer layer of a second nitride semiconductor, the buffer layer being provided on or above the base;
   a channel layer of a third nitride semiconductor, the channel layer being provided on or above the buffer layer and the channel layer having an opening portion;
   a barrier layer of a fourth nitride semiconductor, the barrier layer being provided on or above the channel layer; and
   a contact layer of a fifth nitride semiconductor, the contact layer being provided in the opening portion and in contact with the buffer layer and the channel layer, and the contact layer being electrically conductive,
   wherein a ratio of Al in a composition of the second nitride semiconductor is higher than or equal to a ratio of Al in a composition of the third nitride semiconductor, and
   wherein a ratio of Al in a composition of the first nitride semiconductor and a ratio of Al in a composition of the fourth nitride semiconductor are higher than the ratio of Al in the composition of the second nitride semiconductor.

2. The semiconductor device according to claim 1, wherein a surface of the base is a (0001) surface.

3. The semiconductor device according to claim 1, wherein a composition of the second nitride semiconductor at a surface in contact with the contact layer is represented by $Al_{x1}Ga_{1-x1}N$ where $0.00 \leq x1 \leq 0.20$.

4. The semiconductor device according to claim 1, wherein the third nitride semiconductor and the fifth nitride semiconductor include Ga.

5. The semiconductor device according to claim 1, wherein the third nitride semiconductor and the fifth nitride semiconductor are GaN.

6. The semiconductor device according to claim 1, wherein a composition of the fourth nitride semiconductor is represented by $In_{y2}Al_{x2}Ga_{1-x2-y2}N$ where $0.00 \leq x2 \leq 1.00$ and $0.00 \leq y2 \leq 0.20$.

7. The semiconductor device according to claim 1, wherein a thickness of the channel layer is 50 nm or less.

8. The semiconductor device according to claim 1, wherein the fifth nitride semiconductor contains an n-type impurity at a concentration of $1 \times 10^{17}$ cm$^{-3}$ to $5 \times 10^{20}$ cm$^{-3}$.

9. The semiconductor device according to claim 1, wherein the fifth nitride semiconductor contains Si, Ge, or O or any combination of Si, Ge, and O as an n-type impurity.

10. The semiconductor device according to claim 1, further comprising:
    an electrode provided on the contact layer.

11. The semiconductor device according to claim 1, wherein the base includes
    a substrate; and
    a layer of a sixth nitride semiconductor provided on the substrate.

12. The semiconductor device according to claim 1, wherein a portion of the buffer layer below the contact layer is thinner than a portion of the buffer layer below the channel layer.

13. An amplifier comprising the semiconductor device according to claim 1.

14. A power supply apparatus comprising the semiconductor device according to claim 1.

* * * * *